United States Patent [19]
Maruyama et al.

[11] Patent Number: 5,808,333
[45] Date of Patent: Sep. 15, 1998

[54] AMPLIFYING TYPE SOLID-STATE IMAGING DEVICE AND METHOD OF MANUFACTURING THE SAME

[75] Inventors: Yasushi Maruyama, Tokyo; Hideshi Abe, Kanagawa; Kazuya Yonemoto, Tokyo; Takahisa Ueno; Junji Yamane, both of Kanagawa, all of Japan

[73] Assignee: Sony Corporation, Tokyo, Japan

[21] Appl. No.: 724,959

[22] Filed: Oct. 2, 1996

[30] Foreign Application Priority Data

Oct. 4, 1995 [JP] Japan ................................. 7-257826
Mar. 26, 1996 [JP] Japan ................................. 8-070438

[51] Int. Cl.$^6$ ...................... H01L 31/062; H01L 31/113; H01L 29/76; H01L 29/94
[52] U.S. Cl. .......................................... 257/290; 257/345
[58] Field of Search ..................... 257/290, 345

[56] References Cited

U.S. PATENT DOCUMENTS 5,506,434   4/1996   Yonemoto .

FOREIGN PATENT DOCUMENTS 5283682   10/1993   Japan .

*Primary Examiner*—Stephen Meier
*Attorney, Agent, or Firm*—Hill & Simpson

[57] ABSTRACT

In an amplifying type solid-state imaging device having a pixel MOS transistor, the occurrence of blooming can be suppressed and an amount of signal charges can be increased. A second conductivity-type overflow-barrier region (23) and a first conductivity-type semiconductor region (24) are sequentially formed on a first conductivity-type semiconductor substrate (22). A pixel MOS transistor (29) comprising a source region (27), a drain region (28) and a gate portion (26) is formed on the first conductivity-type semiconductor region (24), and a second conductivity-type channel stopper region (41) for signal charges accumulated in the first conductivity-type semiconductor region (24) of the gate portion (26) is formed within the first conductivity-type semiconductor region (24) formed just below the drain region (28).

9 Claims, 16 Drawing Sheets

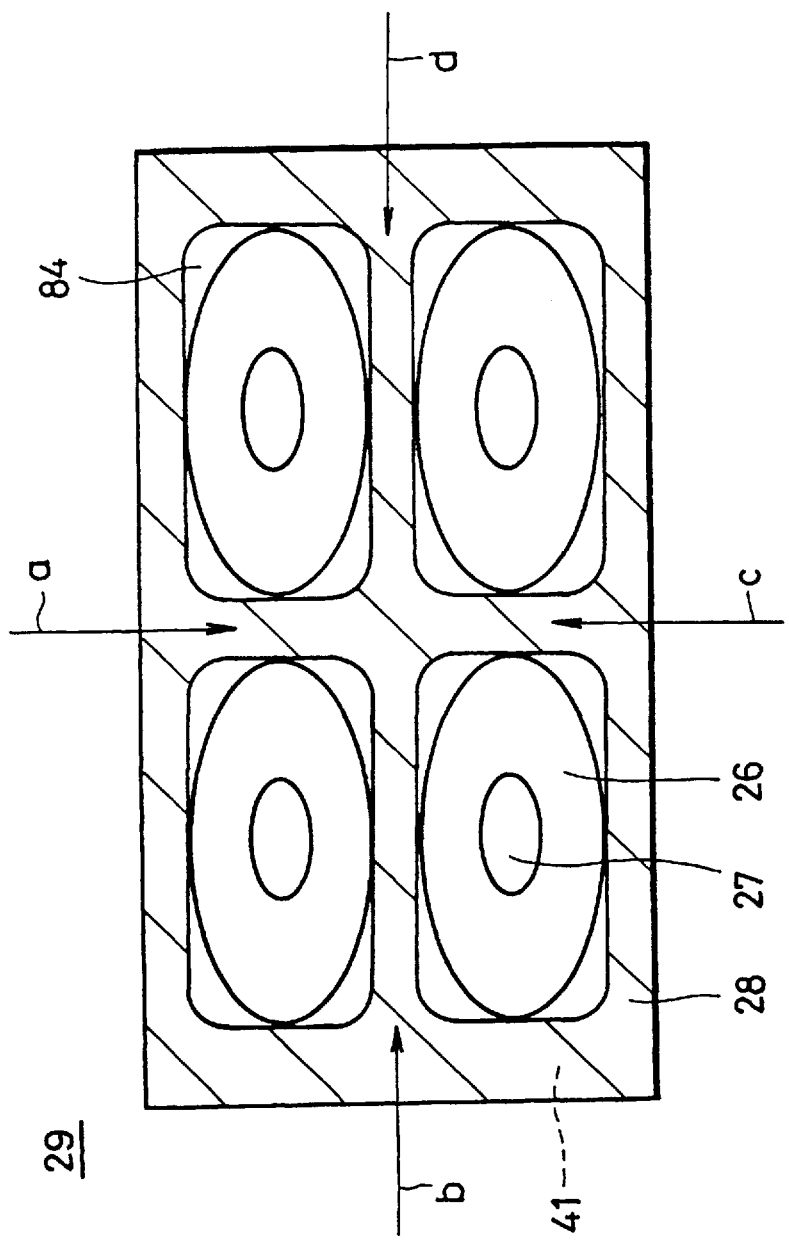

AMPLIFYING TYPE SOLID-STATE IMAGING DEVICE AND METHOD OF MANUFACTURING THE SAME

BACKGROUND OF THE INVENTION

The present invention relates to an amplifying type solid-state imaging device and a method of manufacturing the same.

Recently, in accordance with an increasing demand that a solid-state imaging device provides a higher resolution, there has been developed an amplifying type solid-state imaging device in which charges of light signal are amplified at every pixel. This amplifying type solid-state imaging device includes an MOS (metal-oxide-semiconductor) transistor disposed at every pixel for carrying out a certain signal-conversion in which photoelectric-converted charge is accumulated in the pixel and this charge is outputted as a current-modulated component of a transistor.

FIGS. 1 and 2 of the accompanying drawings show an amplifying type solid-state imaging device.

As shown in FIG. 2, an amplifying type solid-state imaging device 1 comprises a first conductivity-type, e.g., p-type silicon semiconductor substrate 2 on which a second conductivity-type, i.e., n-type semiconductor region, i.e., overflow-barrier region 3 and a p-type semiconductor well region 4 are formed. Annular gate electrodes 6 capable of transmitting light are formed on the p-type semiconductor well region 5 through a gate-insulating film 5 made of $SiO_2$ or the like. On the p-type semiconductor well regions 4 corresponding to a central aperture and outer peripheries of the annular gate electrodes 6 are formed an n-type source region 7 and n-type drain regions 8 by self-alignment using the gate electrode 6 as a mask, thereby resulting in an MOS transistor (hereinafter referred to as "pixel MOS transistor) 9 serving as one pixel being arranged. The annular gate electrode 6 may be made of a thin or transparent material which can be prevented from absorbing light as much as possible. In this embodiment, the annular gate electrode 6 may be made of a thin film polycrystalline silicon. In FIG. 2, reference numeral 10 depicts an interlevel insulator.

As shown in FIG. 1, a plurality of pixel MOS transistors 9 are disposed in a matrix fashion. The source regions of the pixel MOS transistors 9 corresponding to respective columns are connected to common signal lines 11 of first aluminum (Al) layer, for example, formed along the vertical direction. Vertical scanning lines 12 made of second Al layers, for example, are formed at the positions corresponding to respective rows of the pixel MOS transistors 9 so as to become perpendicular to the signal lines 11 in the horizontal direction.

An interconnection layer made of polycrystalline silicon, i.e, U-shaped contact buffer layer 13 is formed across the annular gate electrodes 6 of two pixel MOS transistors 9 adjacent in the horizontal direction and which is extended to the corresponding vertical scanning line 12. Both ends of the contact buffer layer 13 are electrically connected to the two pixel MOS transistors, i.e., the gate electrodes 6, 6 and the intermediate portion of the contract buffer layer 13 is connected to the vertical scanning line 12.

In FIG. 1, reference numeral 15 denotes a contact portion provided between the contact buffer layer 13 and the vertical scanning line 12, and reference numeral 16 denotes a contact portion provided between the source region 7 and the signal line 11.

A drain power-supply line 18 made of a first Al layer, for example, connected to the drain region 8 is formed between the pixel MOS transistors 9 which are not provided across the contact buffer layer 13. In FIG. 1, reference numeral 17 denotes a contact portion between the drain region 8 and the drain power-supply line 18.

In the pixel MOS transistor 9, as shown in FIG. 2, light passed through the annular gate electrode 6 produces electrons-holes, and holes h are accumulated in the p-type semiconductor well region 4 formed under the annular gate electrode 6 as signal charges. When the pixel MOS transistor 9 is turned on on application of high voltage to the annular gate electrode 6 through the vertical scanning line 12, a drain current $I_d$ is flowed to the surface channel and this drain current $I_d$ is changed by the signal charge h so that this drain current $I_d$ is outputted through the signal line 11 and the changed amount is developed as the signal output.

In the above-mentioned amplifying type solid-state imaging device 1, only the n-type source region 7 and the n-type drain region 8 are formed on the p-type semiconductor well region 4 as shown in FIGS. 3 and 4 which are a fragmentary plan view and a fragmentary cross-sectional view of the pixel MOS transistor 9.

As shown in a potential diagram of FIG. 5 which illustrates a simulated result of potential obtained in the charge accumulated state of the pixel MOS transistor, a potential barrier at the drain portion serving as a channel-stopper region is not formed at all except the surface of the drain region. Moreover, a potential barrier of the overflow-barrier region 3 is at about a diffusion potential and is not formed substantially.

As a result, a blooming in which accumulated signal charges are leaked to adjacent pixel MOS transistor side tends to occur, and hence an amount of signal charges accumulated in the pixels is not sufficient for the amplifying type solid-state imaging device.

SUMMARY OF THE INVENTION

In view of the aforesaid aspect, it is an object of the present invention to provide an amplifying type solid-state imaging device and a method of manufacturing the same in which the occurrence of blooming can be suppressed and an amount of signal charges can be increased.

In the amplifying type solid-state imaging device according to the present invention, a second conductivity-type channel stopper region for signal charges accumulated in a first conductivity-type semiconductor region at its portion corresponding to the under portion of a gate portion is formed in the first conductivity-type semiconductor region formed just below a drain region constructing an amplifying type pixel transistor.

In this amplifying type solid-state imaging device, the channel stopper region is formed on the first conductivity-type semiconductor region formed just under the drain region of an amplifying type pixel transistor, whereby signal charges accumulated in the first conductivity-type semiconductor region formed beneath the gate portion can be prevented from being leaked to the adjacent amplifying type pixel transistor, thereby avoiding a blooming from occurring. Also, an amount of signal charges is increased.

According to a method of manufacturing an amplifying type solid-state imaging device of the present invention, after a second conductivity-type overflow-barrier region, a first conductivity-type semiconductor region and a gate insulating film are sequentially formed on a first conductivity-type semiconductor substrate, a channel stopper region is selectively formed at the position corresponding to the under portion of the drain region within the first conductivity-type semiconductor region by implantation ions. Then, an amplifying type pixel transistor is formed by forming a source region and a drain region on the surface of the first conductivity-type semiconductor region by implanting ions by using an annular gate electrode formed on the gate insulating film as a mask.

According to this manufacturing method, when the amplifying type pixel transistor is formed, after the channel stopper region was formed on the first conductivity-type semiconductor region, the source region and the drain region are formed by self-alignment by using the gate electrode as a mask. Thus, it is possible to easily manufacture an amplifying type solid-state imaging device in which the occurrence of blooming can be prevented, i.e., the channel stopper region is formed just under the drain region.

According to other method of manufacturing an amplifying type solid-state imaging device of the present invention, after a second conductivity-type overflow-barrier region, a first conductivity-type semiconductor region, a gate insulating film and a gate electrode material layer were sequentially formed on a first conductivity-type semiconductor substrate, a source region and a drain region are formed on the first conductivity-type semiconductor region by first ion implantation by using the same mask, and a channel stopper region is formed on the first conductivity-type semiconductor region formed just under the drain region by second ion implantation. Thereafter, an amplifying type pixel transistor is formed by patterning the gate electrode material layer by the same mask.

According to this manufacturing method, since the channel stop region, the source region, the drain region and the gate electrode are formed by self-alignment by the same mask, regions and gate electrode can be formed each other with a high positional accuracy. In particular, the channel stopper region can be formed with a high accuracy without being displaced with respect to the drain region. Also, the number of mask processes can be reduced. Incidentally, according to this manufacturing method, a second conductivity-type ion implanted region is formed just below the source region by the second ion implantation.

In other method of manufacturing an amplifying type solid-state imaging device according to the present invention, after a second conductivity-type overflow-barrier region, a first conductivity-type semiconductor region, a gate insulating film and a gate electrode material layer are sequentially formed on a first conductivity-type semiconductor substrate, a gate electrode is formed by patterning the gate electrode material layer by using a mask. Thereafter, a source region and a drain region are formed on the first conductivity-type semiconductor region by first ion implantation by the same mask and a channel stopper region is formed on the first conductivity-type semiconductor region formed just under the drain region by second ion implantation.

According to this manufacturing method, since the annular gate electrode, the source region, the drain region and the channel stopper region are formed by self-alignment by using the same mask, the regions and the gate electrode can be formed each other with a high positional accuracy. In particular, the channel-stopper region can be formed with a high accuracy without being positionally displaced with respect to the drain region. Also, the number of mask process can be decreased. According to this manufacturing method, the second conductivity-type ion implanted region can be formed just under the source region by the second ion implantation.

In other method of manufacturing an amplifying type solid-state imaging device according to the present invention, a second conductivity-type overflow-barrier region, a first conductivity-type semiconductor region and a gate insulating film are sequentially formed on a first conductivity-type semiconductor substrate and a first conductivity-type ion implanted region is formed at the position corresponding to the under portion of the source region of the first conductivity-type semiconductor region by implanting ions by using a first mask. Then, after the gate electrode material layer was formed on the gate insulating film, a source region and a drain region are formed on the first conductivity-type semiconductor region by first ion implantation by using a second mask. A second conductivity-type impurity is implanted on the first conductivity-type ion implanted region at the same time the channel stopper region is formed on the first conductivity-type semiconductor region formed just below the drain region by second ion implantation. Thereafter, an annular gate electrode is formed by patterning the gate electrode material layer by using the same second mask to thereby form an amplifying type pixel transistor.

According to this manufacturing method, since the source region, the drain region, the channel stopper region formed just below the drain region and the gate electrode can be formed by self-alignment by using the second mask, the regions and the gate electrode can be formed each other with a high positional accuracy. In particular, the channel stopper region can be formed with a high accuracy without being positionally displaced with respect to the drain region. At the same time, the first conductivity-type ion implanted region is previously formed below the source region and the second conductivity-type impurity is implanted on this ion implanted region in the second ion implantation, whereby the concentration of the second conductivity-type ion implanted region formed just below the source region can be controlled. For example, when the width of the drain region between the pixels is narrow, the potential barrier of the overflow-barrier region is formed properly by forming the second conductivity-type ion implanted region just below the source region. When the width of the drain region between the pixels is wide, the second conductivity-type ion implanted region can be prevented from being formed just below the source region by ion implantation. Thus, the potential barrier of the overflow-barrier region can be controlled properly.

According to other method of manufacturing an amplifying type solid-state imaging device of the present invention, a second conductivity-type overflow-barrier region, a first conductivity-type semiconductor region, a gate insulating film and a gate electrode material layer are sequentially formed on a first conductivity-type semiconductor substrate, and a first conductivity-type ion implanted region is selectively formed at the position corresponding to the under portion ranging from the source region of the first conductivity-type semiconductor region to a part of gate portion by using a first mask. Then, a source region and a drain region are formed on the first conductivity-type semiconductor region by first ion implantation by using a second mask and a second conductivity-type impurity is implanted on the first conductivity-type ion implanted region at the same time the channel stopper region is formed in the first conductivity type semiconductor region formed just below the drain region by using the second mask. Thereafter, an annular gate electrode is formed by patterning the gate electrode material layer by using the same second mask, thereby resulting in the amplifying type pixel transistor being formed.

According to this manufacturing method, since the source region, the drain region, the channel stopper region and the annular gate electrode can be formed by self-alignment by using the second mask, the regions and the gate electrode can be formed each other with a high positional relationship. In particular, the channel stopper region can be formed with a high accuracy without being positionally displaced with respect to the drain region.

At the same time, if the first conductivity-type ion implanted region is previously formed just under the source region ranging from the source region to a part of gate portion and a second conductivity-type impurity is implanted on this ion implanted region in the second ion implantation using the second mask, then even when the first and second mask are displaced a little positionally, the second conductivity-type ion implanted region of substantially the same concentration as that of the channel stopper region can be prevented from being formed under the source region.

According to the present invention, there is provided a solid-state imaging device which is comprised of a first conductivity-type semiconductor substrate on which a second conductivity-type overflow-barrier region and a first conductivity-type semiconductor region are formed sequentially, a pixel transistor comprising a source region, a drain region and a gate portion and formed on the first conductivity-type semiconductor region, and a second conductivity-type channel stopper region for signal charges accumulated in the first conductivity-type semiconductor region of the gate portion being formed within the first conductivity-type semiconductor region formed just below the drain region.

In the solid-state imaging device, an impurity concentration of the channel stopper region is lower than that of the drain region.

In the solid-state imaging device, the first conductivity-type semiconductor region exists between the source region and the overflow-barrier region.

In the solid-state imaging device, the first conductivity-type semiconductor region exists between the channel stopper region and the overflow-barrier region.

In the solid-state imaging device, a potential of the channel stopper region is shallower than that of the overflow-barrier region and deeper than that of the drain region.

In the solid-state imaging device, there is provided a means for applying a reset voltage to the semiconductor substrate.

In the solid-state imaging device, the channel stopper region is formed so as to surround the gate portion.

In the solid-state imaging device, a second conductivity-type ion implanted region of impurity concentration lower than that of the channel stopper region is formed within the first conductivity-type semiconductor region formed just below the source region.

According to the present invention, there is provided a method of manufacturing a solid-state imaging device which comprises the steps of forming a gate insulating film on a first conductivity-type semiconductor region by sequentially forming a second conductivity-type overflow-barrier region and a first conductivity-type semiconductor region on the first conductivity-type semiconductor substrate, selectively forming a second conductivity-type channel stopper region at a position corresponding to the under portion of a drain region within the first conductivity-type semiconductor region by implanting ions, forming an annular gate electrode on the gate insulating film, and forming a pixel transistor by forming a source region and a drain region on the surface of the first conductivity-type semiconductor region by implanting ions by using the annular gate electrode as a mask.

According to the present invention, there is provided a method of manufacturing a solid-state imaging device which comprises the steps of sequentially forming a second conductivity-type overflow-barrier region, a first conductivity-type semiconductor region, a gate insulating film and a gate electrode material layer on a first conductivity-type semiconductor substrate, forming an annular gate electrode by selectively patterning the gate electrode layer by using a mask and forming a source region and a drain region on the surface of the first conductivity-type semiconductor region by first ion implantation by using the mask and forming a second conductivity-type channel stopper region at the position corresponding to the under portion of the drain region of the first conductivity-type semiconductor region by second ion implantation to thereby form a pixel transistor.

According to the present invention, there is provided a method of manufacturing a solid-state imaging device which comprises the steps of sequentially forming a second conductivity-type overflow-barrier region, a first conductivity-type semiconductor region and a gate insulating film on a first conductivity-type semiconductor substrate, selectively forming a first conductivity-type ion implanted region at the position corresponding to the under portion of a source region of the first conductivity-type semiconductor region by implanting ions by using a first mask, forming a gate electrode material layer on the gate insulating film, selectively forming a source region and a drain region on the surface of the first conductivity-type semiconductor region by first ion implantation by using a second mask and implanting a second conductivity-type impurity on the ion implanted region at the same time a second conductivity-type channel stopper region is formed at the position corresponding to the under portion of the drain region of the first conductivity-type semiconductor region by the second ion implantation, and forming an annular gate electrode by selectively patterning the gate electrode material layer by using the second mask to thereby form a pixel transistor.

According to the present invention, there is provided a method of manufacturing a solid-state imaging device which comprises the steps of sequentially forming a second conductivity-type overflow-barrier region, a first conductivity-type semiconductor region, a gate insulating film and a gate electrode material layer, selectively forming a first conductivity-type ion implanted region at the position corresponding to the under portion ranging from a source region of the first conductivity-type semiconductor region to a part of gate portion by using a first mask, forming a source region and a drain region on the surface of the first conductivity-type semiconductor region by first ion implantation by using a second mask and implanting a second conductivity-type impurity on the ion implanted region at the same time a second conductivity-type channel stopper region is formed at the position corresponding to the under portion of the drain region by second ion implantation, and forming an annular gate electrode by selectively patterning the gate electrode material layer by using the second mask to thereby form a pixel transistor.

BRIEF DESCRIPTION OF THE DRAWINGS

FIG. 17 is a plan view illustrating a yet further example of a method of manufacturing an amplifying type solid-state imaging device according to the present invention.

DETAILED DESCRIPTION OF THE PREFERRED EMBODIMENTS

Figure 1:
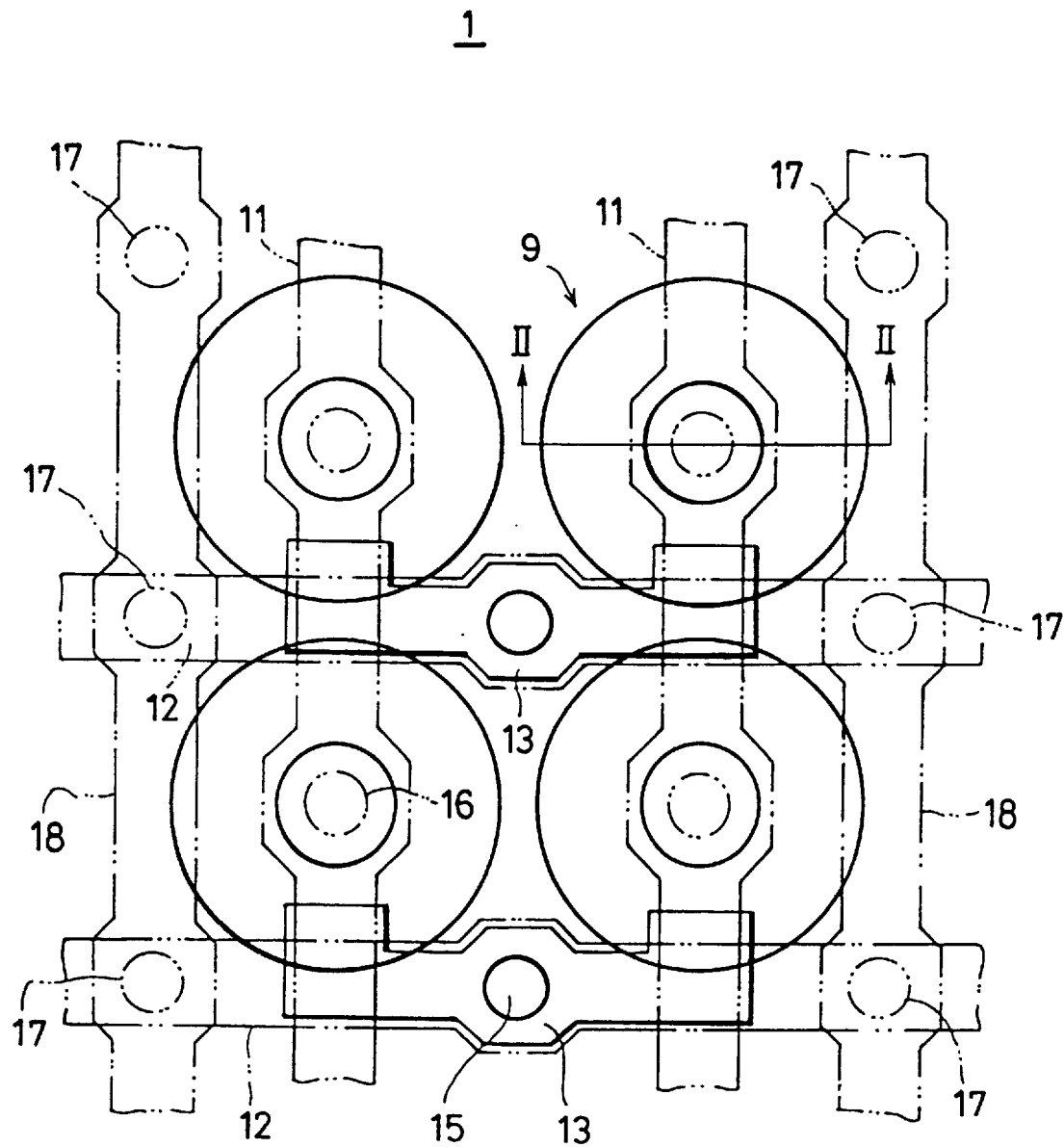
FIG. 1 is a plan view illustrating an amplifying type solid-state imaging device according to a comparative example.
Figure 2:
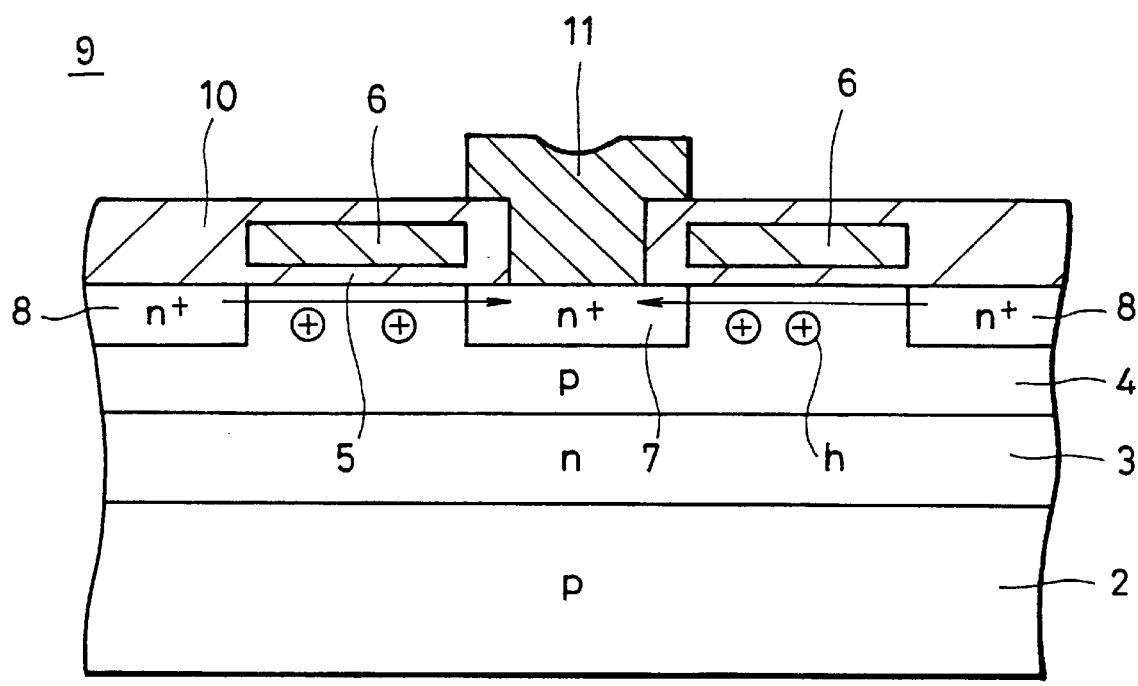
FIG. 2 is a cross-sectional view taken along the line II—II in FIG. 1.
Figure 6:
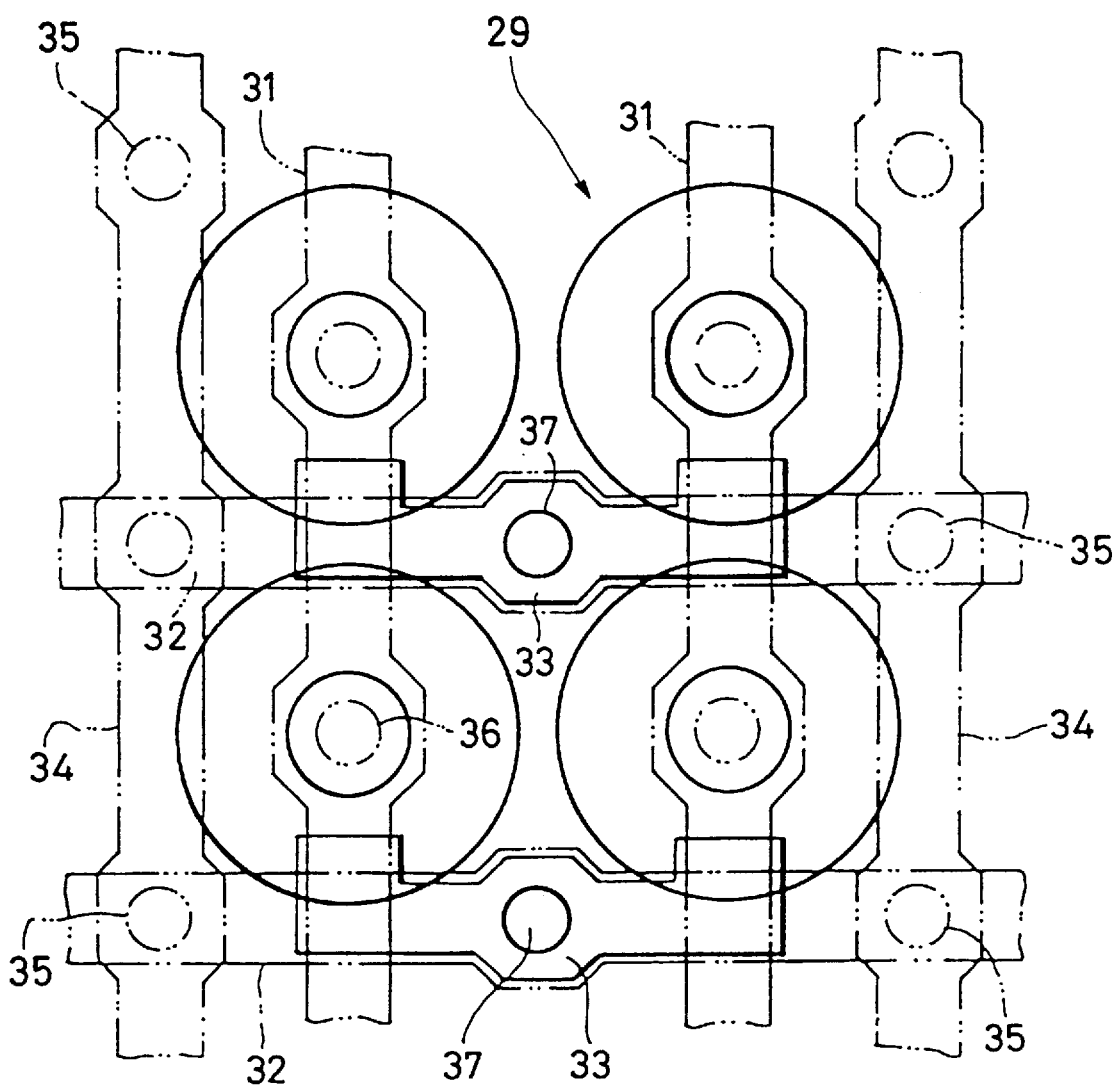
FIG. 6 is a plan view illustrating an amplifying type solid-state imaging device according to an embodiment of the present invention.
Figure 7:
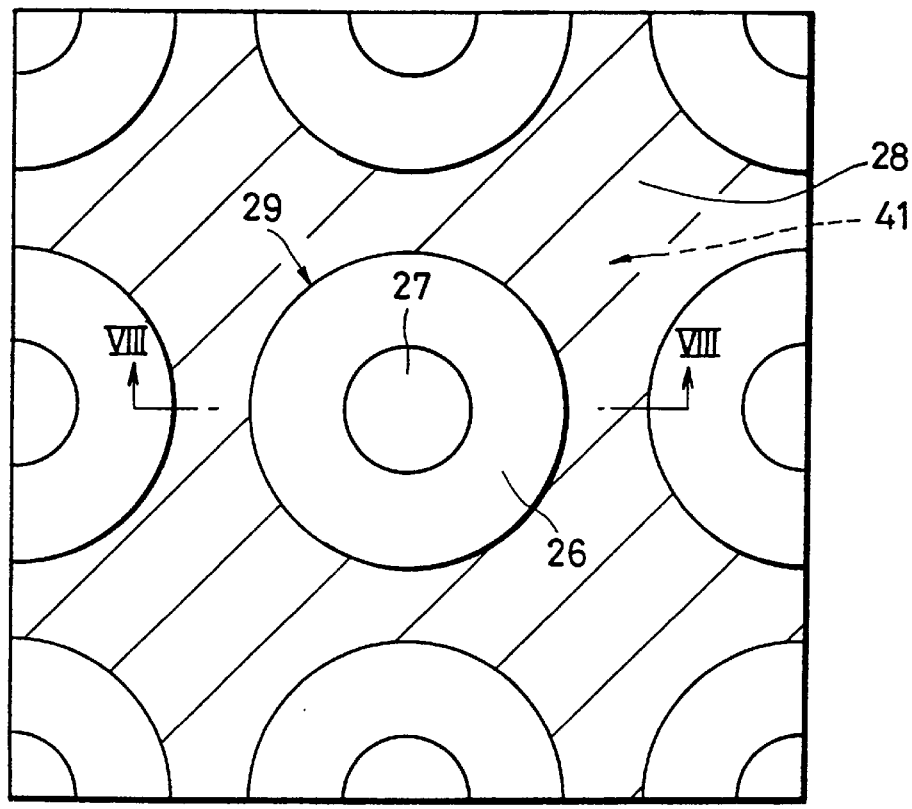
FIG. 7 is a plan view illustrating only a pixel MOS transistor according to the present invention.
Figure 8:
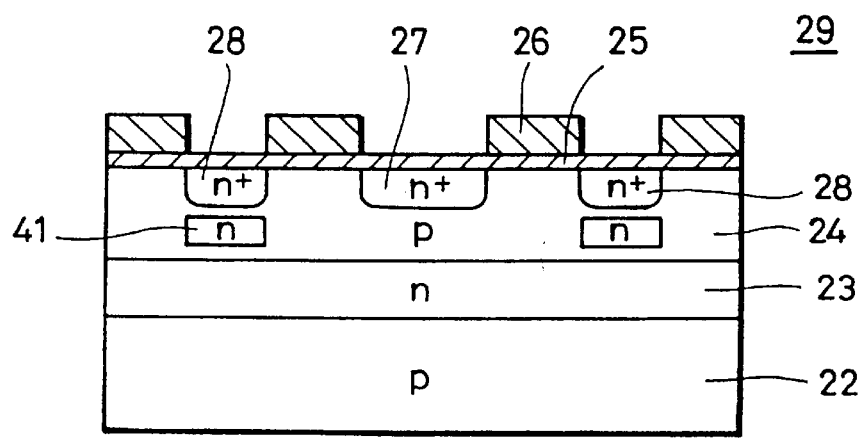
FIG. 8 is a cross-sectional view taken along the line VIII—VIII in FIG. 7.

FIGS. 6 through 8 illustrate an example of a fundamental arrangement of an amplifying type solid-state imaging device according to the present invention. Specifically, FIG. 6 is a plan view, FIG. 2 is a plan view illustrating only a pixel MOS transistor from which signal lines, vertical scanning lines, contact buffer layers and drain power-supply lines are removed, and FIG. 8 is a cross-sectional view taken along the line VIII—VIII in FIG. 7.

As shown in FIGS. 6 through 8, an amplifying type solid-state imaging device 21 according to present invention comprises, similarly as described above, a first conductivity-type, e.g., p-type silicon semiconductor substrate 22 on which second conductivity-type, i.e., n-type semiconductor layers, i.e., an overflow-barrier region 23 and a p-type semiconductor well region 24 are formed. Annular gate electrodes 26 capable of transmitting light are formed on the p-type semiconductor well region 24 through a gate insulating film 25 made of $SiO_2$ or the like. An n-type source region 27 and n-type drain regions 28 are formed on the central aperture and outer peripheries of the annular gate electrode 26 so as to sandwich the gate electrode 26 by ion injection based on self-alignment, whereby a pixel MOS transistor 29 serving as one pixel is arranged.

The annular gate electrode 26 is made of a thin or transparent material which is made difficult to absorb light as much as possible. The annular gate electrode 26 may be made of polycrystalline silicon, tungsten polycide, tungsten silicide or the like. In this embodiment, there may be used a thin film polycrystalline silicon having an excellent transmission.

As shown in FIGS. 6 and 7, a plurality of pixel MOS transistors 29 are arranged in a matrix fashion. Source regions 27 of the pixel MOS transistors 29 corresponding to respective columns are connected to a common signal line 31 made of a first Al layer, for example, formed along the vertical direction, and vertical scanning lines 32 made of second Al layer, for example, are formed at the position between rows of the pixel MOS transistors 29 so as to become perpendicular to the signal line 31 along the horizontal direction.

U-shaped interconnection layers, i.e., contact buffer layers 33 are elongated to the annular gate electrodes 26 of the two pixel MOS transistors 29 adjacent in the horizontal direction and the vertical scanning line 32. The contact buffer layers 33, the two pixel MOS transistors 29 and the vertical scanning lines 32 are connected together.

A drain power-supply line 34 made of a first Al layer, for example, connected to the drain region 28 is formed between the pixel MOS transistors 29 which are not laid across the contact buffer layer 33. In FIG. 6, reference numeral 35 denotes a drain contact portion provided between the drain power-supply line 34 and the drain region 28, 36 a source contact portion provided between the source region 27 and the signal line 31, 37 a contact portion provided between the contact buffer layer 33 and the vertical scanning line 33.

In this embodiment, particularly, as shown in FIGS. 7 and 8, a channel stopper region corresponding to signal charges h (see FIG. 2) accumulated in the p-type semiconductor well region 24 formed under the gate portion, i.e., gate electrode 26, in this embodiment, n-type channel stopper region 41 is formed within the p-type semiconductor well region 24 formed just under the drain region 28. The channel stopper region 41 in this embodiment is formed just under the whole region of the drain region 28 so as to surround the gate electrode 36.

The channel stopper region 41 disposed under the drain region 28 may be formed over a range from the drain region 28 to the overflow-barrier region 23. Alternatively, the channel stopper region 41 may be formed in a range from the drain region 28 to the overflow-barrier region 23 without forming a potential dip in such a manner that the p-type semiconductor well region 24 exists at the intermediate portion between the drain region 28 and the overflow-barrier region 23, i.e., the channel stopper region 41 and the overflow-barrier region 23. FIG. 8 shows the case that the channel stopper region 41 is formed at the intermediate portion between the drain region 28 and the overflow-barrier region 23, which is more useful in actual practice as will be described later on.

Figure 9:
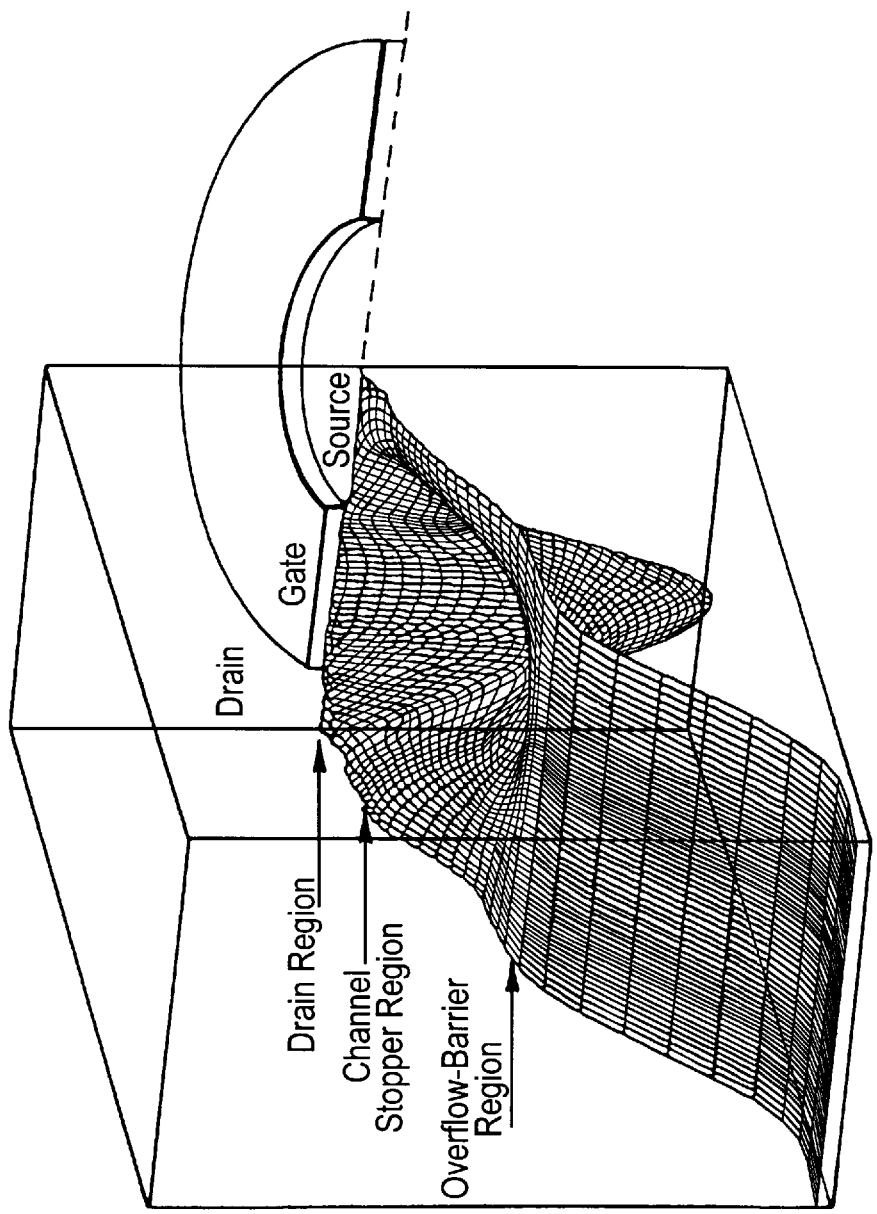
FIG. 9 is a potential diagram of the pixel MOS transistor according to the present invention.

In the signal charge accumulated state, by controlling impurity concentration, as shown in FIG. 9, the potential thereof is set such that it become shallower than that of the overflow-barrier region 23 and that it becomes deeper than that of the drain region 28.

The impurity concentration of the channel stopper region 41 has to be set to such one that a potential dip may not be formed when the signal charges h are discharged to the semiconductor substrate 22 side by the reset operation or electronic shutter operation, for example. Accordingly, the impurity concentration of the channel stopper region 41 is set to be lower than that of the drain region 28 and set to be higher than that of the overflow-barrier region 23. A concentration difference among the regions 28, 41 and 23 can be changed by figure each, for example.

This amplifying type solid-state imaging device is provided with means for applying a predetermined reset voltage or electronic shutter voltage to the semiconductor substrate 22 in the reset operation or electronic shutter operation (these means will be collectively referred to as "reset voltage applying means").

In the reset operation or electronic shutter operation, a predetermined voltage is applied to the gate electrode of the selected pixel and no gate voltage is applied to the non-selected pixel so that, even when a common substrate voltage (reset voltage) is applied to the pixels, only the signal charge of the selected pixel is reset.

Incidentally, when the channel stopper region 41 is formed, a substrate voltage required by the reset operation (or electronic shutter operation) should be increased (should be increased in absolute value). Therefore, according to this embodiment, in order to prevent the substrate voltage necessary for the reset operation (or electronic shutter operation) from being lowered too much (absolute value from being increased too much), it should be preferable that the impurity concentration of the channel stopper region 41 should be set to an optimum value as low as possible.

According to the amplifying type solid-state imaging device 21 of this embodiment, since the n-type channel stopper region 41 is formed just under the whole region of the drain region 28 surrounding the gate portion, the signal charges h accumulated in the p-type semiconductor well region 24 formed beneath the gate electrode 26 can be prevented from being leaked to the adjacent pixel MOS transistor by the potential barrier formed by this channel stopper region 41. Thus, the occurrence of so-called blooming can be suppressed.

Figure 3:
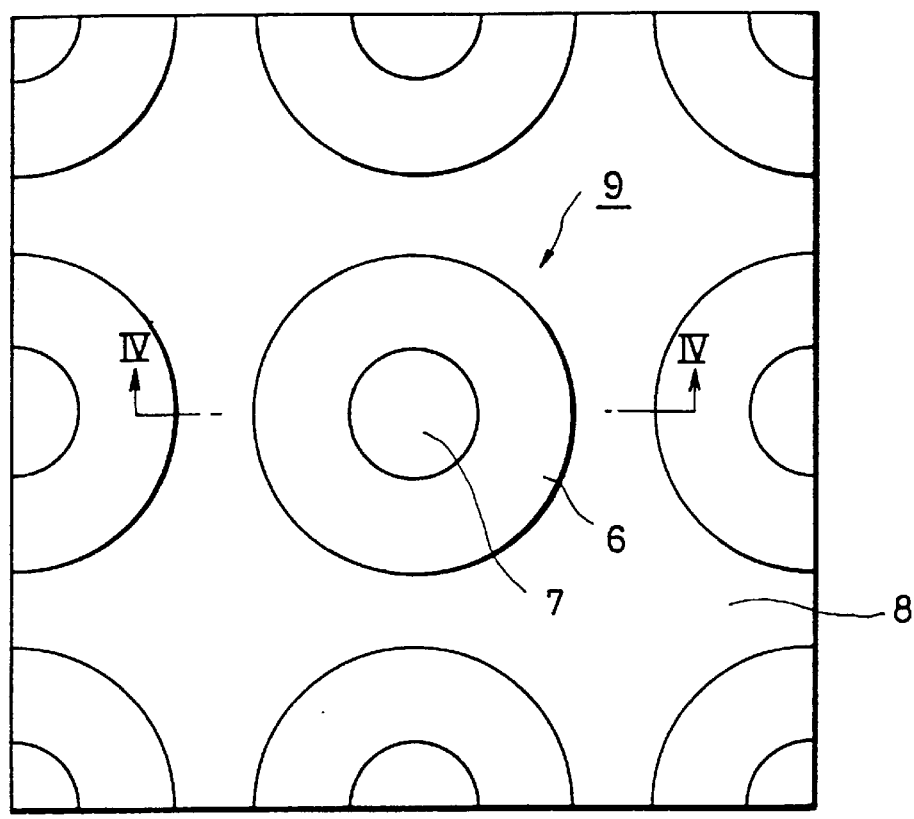
FIG. 3 is a plan view illustrating only the pixel MOS transistor according to the comparative example.
Figure 4:
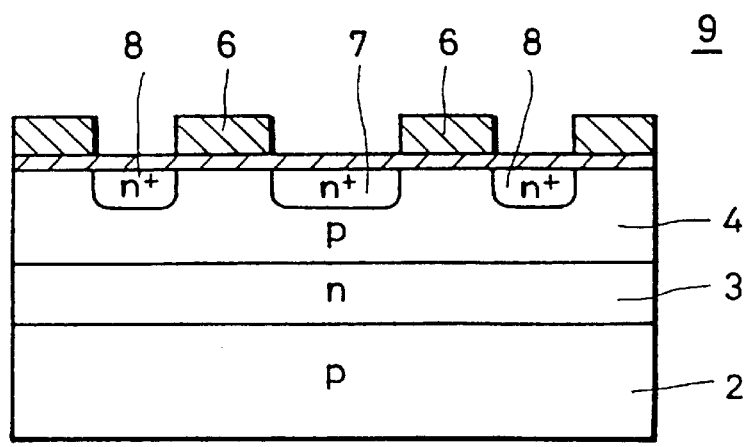
FIG. 4 is a cross-sectional view taken along the line IV—IV in FIG. 3.
Figure 5:
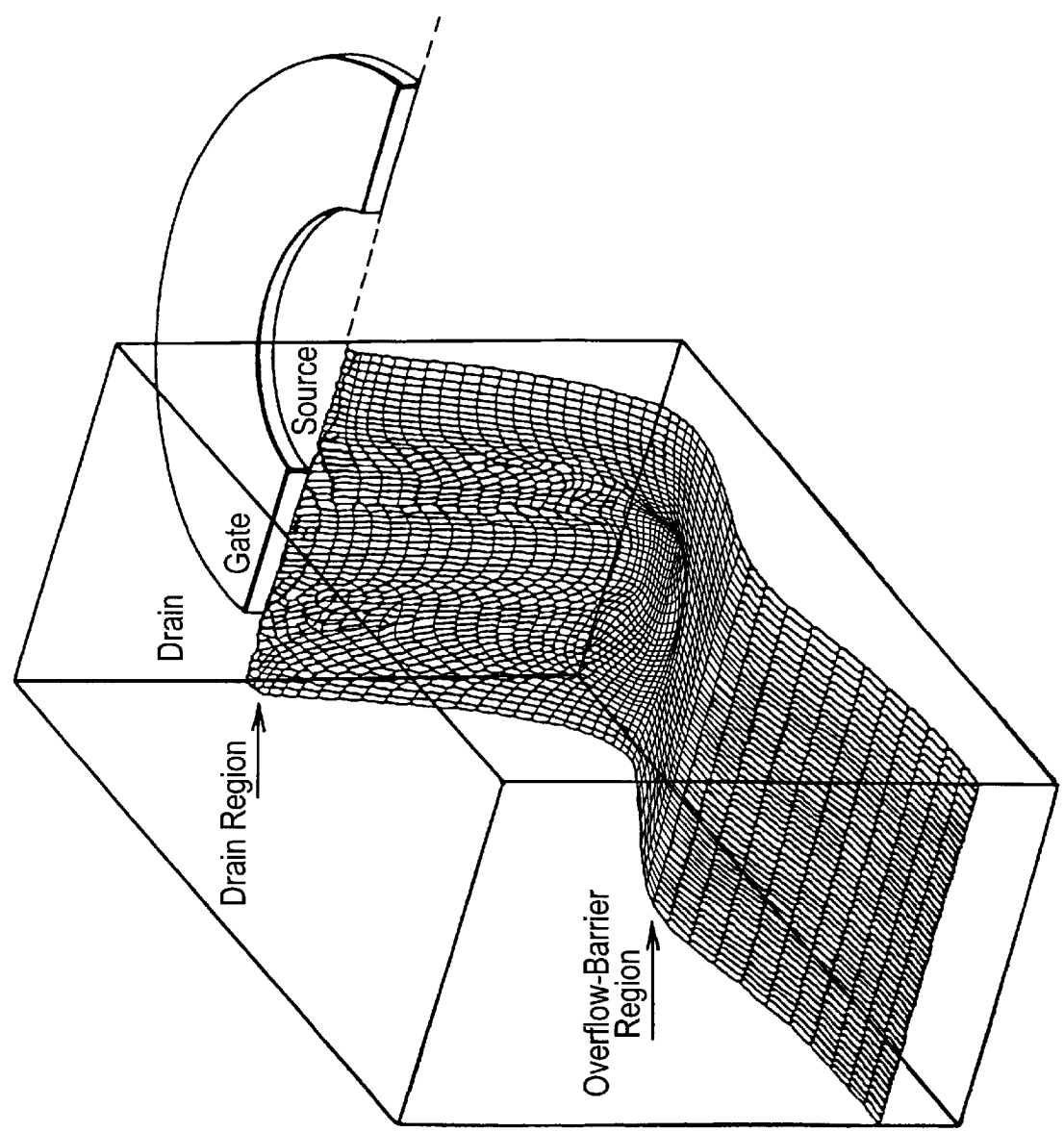
FIG. 5 is a potential diagram of the pixel MOS transistor according to the comparative example.

In the case of the pixel MOS transistor 9 according to the comparative example shown in FIGS. 3 and 4, as shown in the potential diagram of FIG. 5 which reveals simulated results, the potential barrier is not formed at all except the drain region so that the signal charges accumulated under the gate electrode tend to flow through the p-type semiconductor well region 4 to the adjacent pixel MOS transistor. Thus, a blooming tends to occur.

On the other hand, in the case of this embodiment, as shown in the potential diagram of FIG. 9 which shows simulated results (however, FIG. 9 shows the simulated results obtained when an n-type ion implanted region of low concentration is formed just under the source region by implanting ions as will be described later on), the potential barrier is formed on the region except the surface of the drain region 28, i.e., region formed just under the drain region by the channel stopper region 41 so that signal charges h accumulated under the gate electrode 26 can be prevented by the potential barrier formed in the channel stopper region 41 from flowing to the adjacent pixel MOS transistor, thereby preventing the occurrence of blooming.

When the width of the drain region formed between the pixels is wide, the n-type ion implanted region need not be formed just under the source region 27. At that time, the simulated results in the potential diagram of FIG. 9 reveals that the potential obtained just under the source region becomes shallow owing to a three-dimensional effect.

The amount of signal charges is increased by the potential barrier in the channel-stopper region 41 so that an output voltage and the dynamic range can be increased.

In the case of the comparative example of FIG. 5, of holes and electrons produced by photoelectric conversion, electrons are accumulated in the overflow-barrier region and modulate the potential of the overflow-barrier region. According to this embodiment, since there is provided the channel stopper region 41, electrons are absorbed by the drain region 28 through the channel stopper region 41. Accordingly, potentials in the overflow-barrier region and the sensor region can be prevented from being modulated by electrons.

The channel stopper region 41 may be formed over all ranges from the drain region 28 to the overflow-barrier region 23. However, since the channel stopper region 41 is formed at a relatively deep position, ions should be implanted a plurality of times. Whereas, when the channel stopper region 41 is formed by implanting ions one time, the channel stopper region 41 is formed within the p-type semiconductor well region 24 so that a junction is formed at the intermediate position. However, a potential at the junction portion is broken on application of substrate voltage with the result that the drain region is continued to the overflow-barrier region from a potential standpoint.

In actual practice, if an n-type channel stopper region 41 of proper impurity concentration is formed at the intermediate portion between the drain region 28 and the overflow-barrier region, then the drain region 28 and the overflow-barrier region can be continued from a potential standpoint without forming the potential dip. The whole region from the drain region 28 to the overflow-barrier region 24 need not be continued by the channel stopper region 41 and may be connected potentially. Accordingly, in this case, ions may be implanted once and the manufacturing process becomes easy.

If the impurity concentration of the channel stopper region 41 is increased too much, then the channel stopper region 41 is concentrated in the n-type region too much, then it becomes impossible to discharge signal charges to the substrate side on application of the substrate voltage in the reset operation or in the shutter operation. On the other hand, according to this embodiment, the impurity concentration of the channel stopper region 41 is set to be lower than that of the drain region 28, thereby making it possible to smoothly carry out the reset operation and the shutter operation.

If the potential of the channel stopper region 41 is made higher than that of the overflow-barrier region 24, then the occurrence of blooming can be suppressed and signal charges can be flowed only to the substrate side in the reset operation or in the shutter operation.

According to this embodiment, since the p-type well region exists between the source region and the overflow-barrier region, as mentioned before, in the reset operation or in the shutter operation in which signal charges are flowed to the substrate side, signal charges can be smoothly discharged to the substrate side without affecting the potential in the overflow-barrier region.

Figure 10:
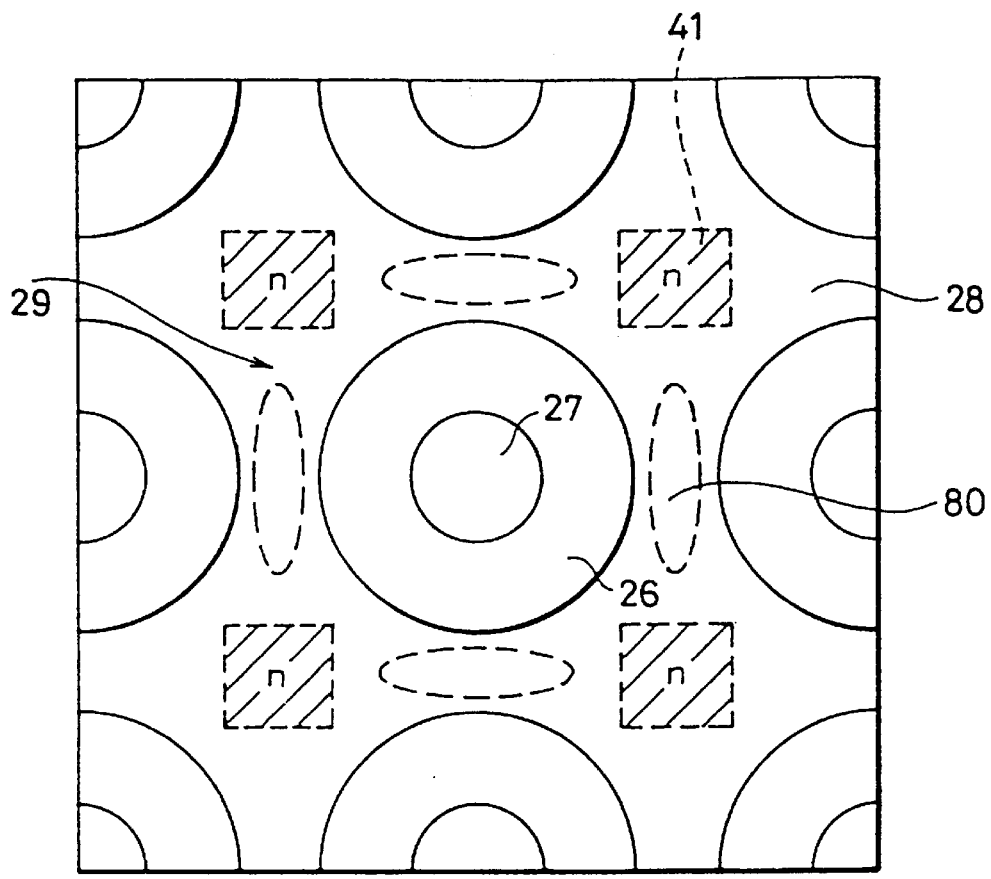
FIG. 10 is a plan view illustrating an amplifying-type solid-state imaging device according to other embodiment of the present invention.

FIG. 10 shows an amplifying type solid-state imaging device according to another embodiment of the present invention. While the channel stopper region 41 is formed just under the drain region so as to surround the gate portion as described in the aforesaid embodiment, according to the embodiment shown in FIG. 10, channel stopper regions 41 are selectively formed at a part surrounding the gate portion, i.e., at the portions corresponding to four corners whose areas are relatively large. A rest of arrangements is similar to that of FIGS. 7 and 8 and therefore need not be described in detail.

According to this embodiment, due to the influence of the channel stopper regions 41 formed at the four corners, potentials of the regions surrounding other gate portions become shallow, thereby forming potential barriers 80. Accordingly, by the potential barriers 80, signal charges can be prevented from being leaked to the adjacent pixel MOS transistor, and hence the occurrence of blooming can be suppressed. In particular, this arrangement is effective for the case in which the widths of the drain regions in the horizontal and vertical directions are reduced as the pixel becomes high in density so that the channel stopper region becomes difficult to be formed around the whole circumference of the gate portion.

Figure 11:
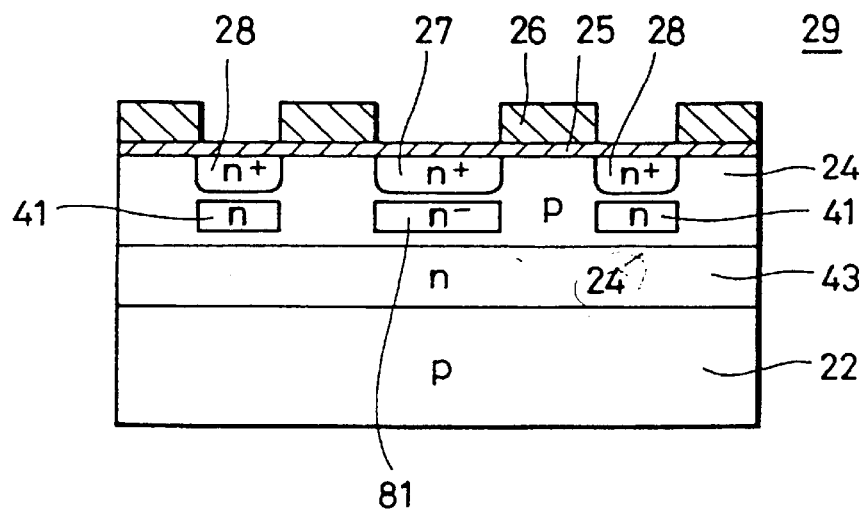
FIG. 11 is a cross-sectional view of a pixel MOS transistor illustrating an amplifying-type solid-state imaging device according to other embodiment of the present invention.

FIG. 11 shows an amplifying type solid-state imaging device according to other embodiment of the present invention.

When the width of the drain region 28 between the pixels is relatively wide, as shown in FIG. 8, it is sufficient that the p-type well region 24 is formed under the source region 27. However, when the width of the drain region 28 between the pixels is reduced, if there is formed only the p-type semiconductor well region 24 under the source region 27 and between the overflow-barrier regions 23, then an overflow-barrier region becomes difficult to be formed.

Therefore, in the embodiment shown in FIG. 11, in a pixel MOS transistor in which the width of the drain region 28 disposed between the pixels is narrow, an n-type ion implanted region 81 with concentration lower than that of the n-type channel stopper region 41 formed just under the drain region 28 is formed within the p-type semiconductor well region 24 formed just below the source region 27.

A rest of arrangement is similar to that of FIG. 8 and like elements and parts identical to those of FIG. 8 are marked with the same references and need not be described.

As described above, in the pixel MOS transistor in which the width of the drain region 28 between the pixels is narrow, the channel stopper region 41 is formed under the drain region 28 and the n-type ion implanted region 81 whose concentration is lower than that of the channel stopper region 41 is formed under the source region 27, whereby the overflow-barrier regions can be formed sufficiently and signal charges can be prevented from being leaked to the adjacent pixel.

Examples of a method of manufacturing the amplifying type solid-state imaging device will be described below.

FIGS. 12A through 12F illustrate an example of a method of manufacturing an amplifying type solid-state imaging device according to the present invention.

Figure 12A:
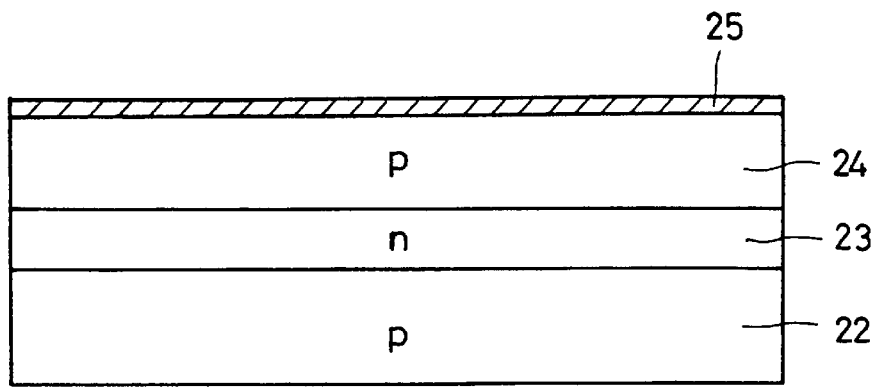
FIGS. 12A through 12F are manufacturing process diagrams showing an example of a method of manufacturing an amplifying type solid-state imaging device according to the present invention.

According to this embodiment, as shown in FIG. 12A, after the n-type overflow-barrier region 23 and a p-type semiconductor well region 24 were sequentially formed on the p-type silicon substrate 22, the gate insulating film 25 made of $SiO_2$ or the like is deposited on the surface of the p-type semiconductor well region 24 by CVD (chemical vapor deposition).

Figure 12B:
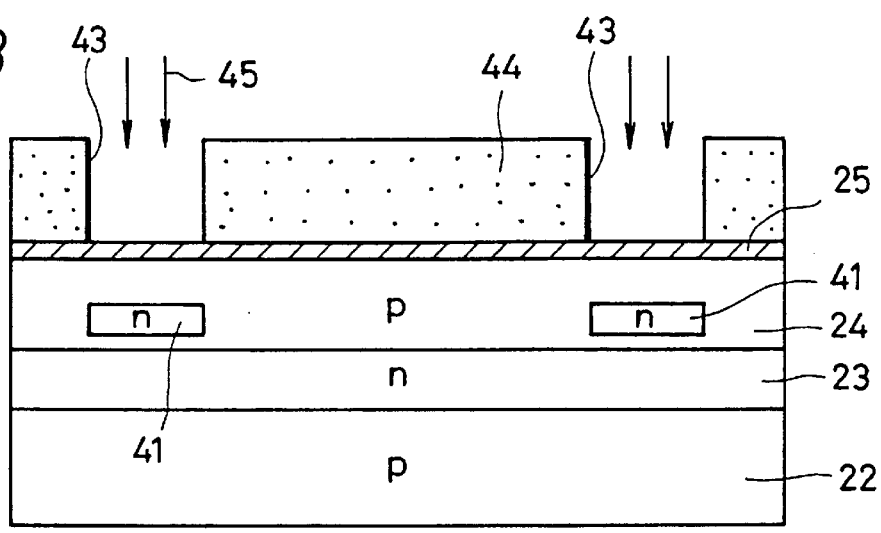

Then, as shown in FIG. 12B, a first photoresist mask 44 having an opening 43 at the position corresponding top the portion just under a drain region which will be formed is formed on the gate insulating film 15, and the n-type channel stopper region 41 is formed within the p-type well region 24 by implanting n-type impurities 45 through this photoresist mask 44. In this case, if ion implantation and diffusion heat treatment are utilized together, then the channel stopper region can be formed with a predetermined width in the depth direction.

Optimum energy and dose amount used when the n-type impurities 45 are ion-implanted are set depending on the width of the drain region, the depth from the surface of the overflow-barrier region, concentration or the like.

Figure 12C:
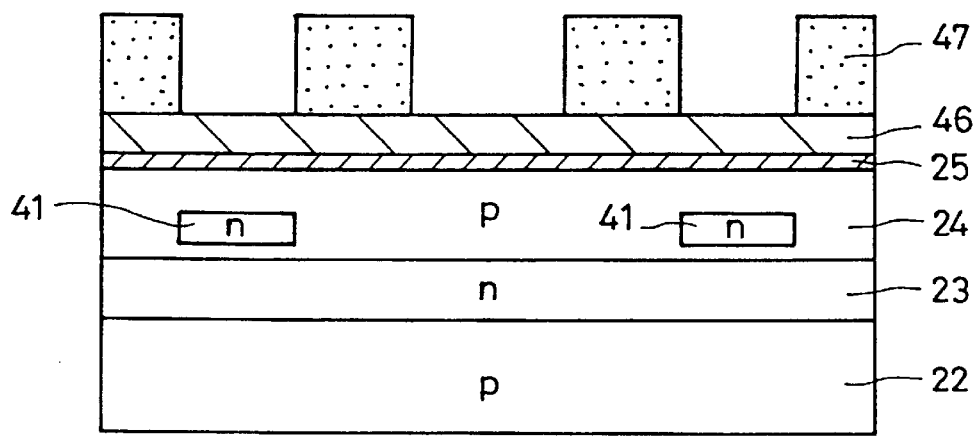

Then, as shown in FIG. 12C, after the first photoresist 44 was removed, an electrode material layer which serves as a gate electrode, e.g., polycrystalline silicon layer 46 is formed on the gate insulating film 25 by CVD, and a second photoresist mask 47 having a pattern corresponding to the gate electrode is formed on this polycrystalline silicon layer 46.

Figure 12D:
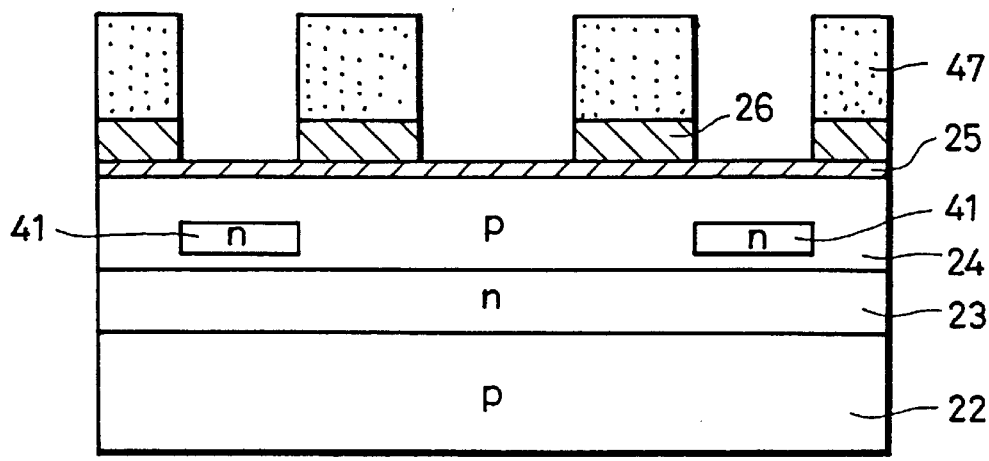

Then, as shown in FIG. 12D, the polycrystalline silicon layer 46 is selectively etched away through the second photoresist mask 47 by anisotropy etching and a gate electrode 26 based on the polycrystalline silicon layer 46 is formed.

Figure 12E:
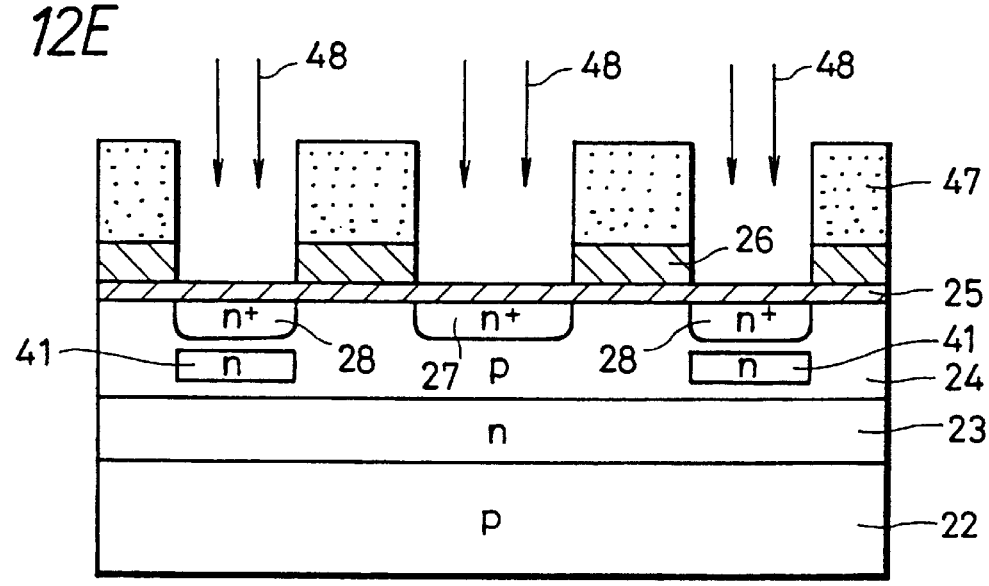

Then, as shown in FIG. 12E, an n-type source region 27 and an n-type drain region 28 are formed on the surface of the p-type semiconductor well region 24 by self-alignment by implanting n-type impurities 48 with the second photoresist mask 47 and the gate electrode 26 used as the ion implantation mask. At that time, the drain region 28 is formed just above the channel stopper region 41.

Figure 12F:
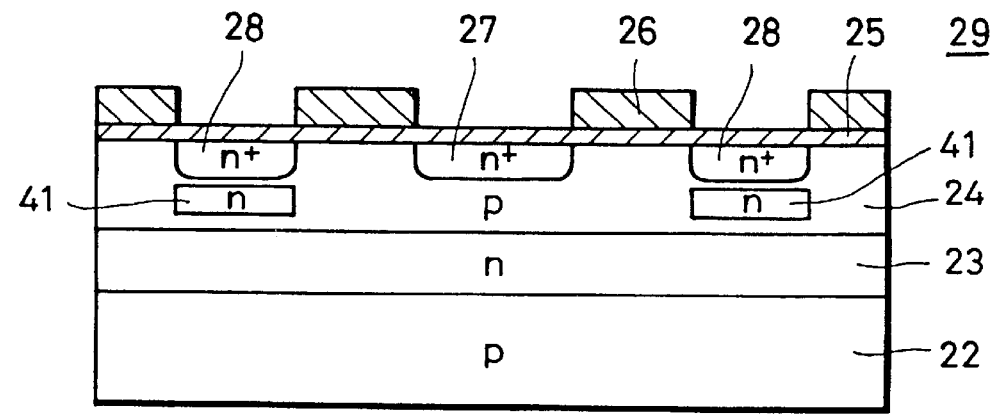

Thereafter, after the second photoresist mask 47 was removed, as shown in FIG. 12F, there is obtained a target pixel MOS transistor 29 in which the channel stopper region 41 is formed within the p-type semiconductor well region 24 formed just under the drain region 28.

According to this manufacturing method, the gate electrode 26, the source region 27 and the drain region 28 are formed with a high accuracy by self-alignment, and the pixel MOS transistor in which the channel stopper region 41 is formed under the drain region 28 can be easily formed with a high accuracy. Thus, it is possible to easily manufacture the amplifying type solid-state imaging device in which a blooming can be prevented from occurring.

Figure 13A:
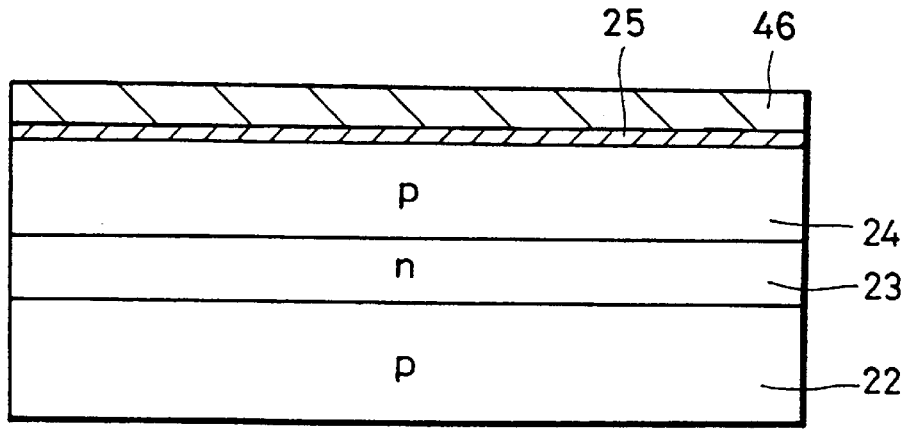
FIGS. 13A through 13C are manufacturing process diagrams showing other example of a method of manufacturing an amplifying type solid-state imaging device according to the present invention.
Figure 13B:
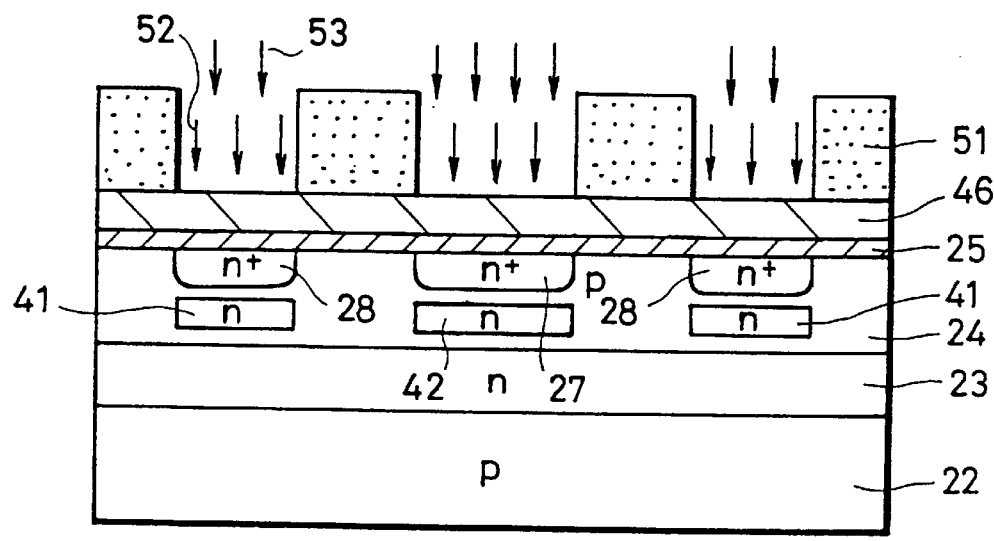
Figure 13C:
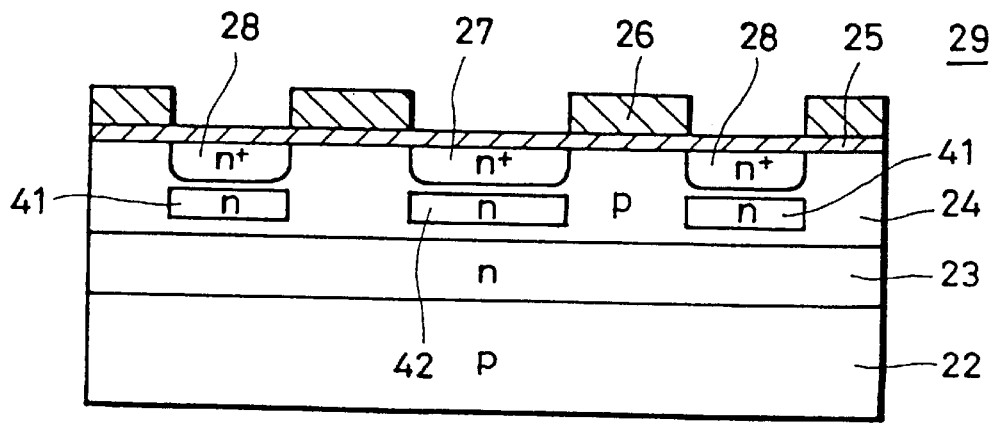

FIGS. 13A through 13C illustrate a method of manufacturing an amplifying type solid-state imaging device according to other embodiment of the present invention.

In this embodiment, as shown in FIG. 13A, after an n-type overflow-barrier region 23 and a p-type semiconductor well region 24 were sequentially formed on a p-type silicon substrate 22, a gate insulating film 25 made of $SiO_2$ or the like and a thin polycrystalline silicon layer 46 which serves as a gate electrode are sequentially formed on the surface of the p-type well region 24 by CVD.

Then, as shown in FIG. 13B, a photoresist mask 51 having patterns corresponding to respective gate electrodes is formed on the polycrystalline silicon layer 46. Then, n-type ion implanted regions 41 and 42 are formed on the drain region and the source region within the p-type well region 24 at corresponding predetermined depth positions by implanting first n-type impurity ions 52 through the photoresist mask 51. The n-type ion implanted region 41 corresponding to the under portion of the drain region acts as a channel stopper region. Then, a source region 27 and a drain region 28 are formed on the surface of the p-type semiconductor well region 24 by implanting second n-type impurity ions 53 by using the same photoresist mask 51. The sequential order in which the first and second ions 52 and 53 are implanted may be arbitrary.

Then, the polycrystalline silicon layer 46 is selectively etched away by using the same photoresist mask 51 to thereby form an annular gate electrode 26, and hence there is obtained a target pixel MOS transistor 29 shown in FIG. 13C in which the n-type ion implanted regions 42 and 41 are respectively formed just under the source region 27 and the drain region 28.

Since the manufacturing method shown in FIGS. 12A through 12C uses the first and second photoresist masks 44 and 47, the first and second photoresist masks 44 and 47 tend to be displaced from each other so that it is difficult to strictly align the drain region 28 and the channel stopper region 41 with each other.

However, according to the manufacturing method shown in FIGS. 13A through 13C, since the source region 27, the drain region 28 and the channel stopper region 41, the gate electrode 26 can be formed by self-alignment by using one photoresist mask 51, the channel stopper region 41 can be formed at the position corresponding to the under portion of the drain region 28 with a high accuracy. At the same time, as compared with the manufacturing method shown in FIGS. 12A through 12F, the mask process can be omitted by one, and hence the manufacturing process can be simplified.

Figure 14A:
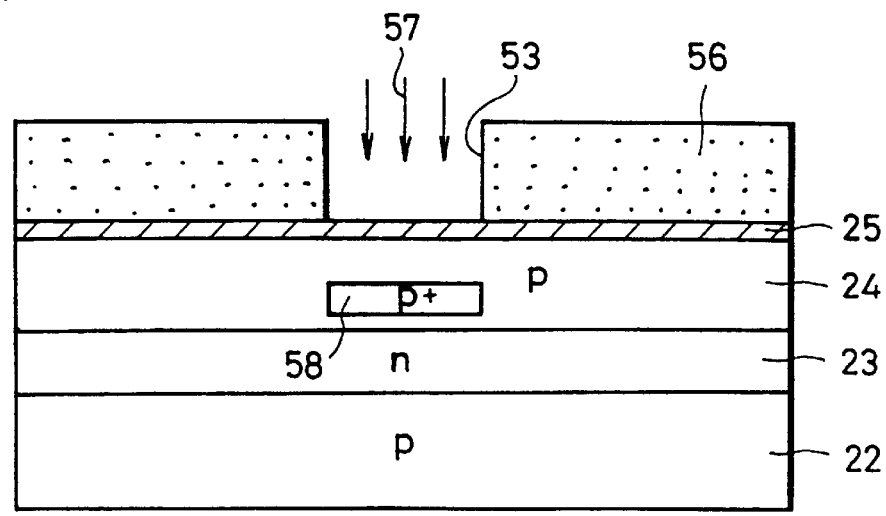
FIGS. 14A through 14C are manufacturing process diagrams showing a further example of a method of manufacturing an amplifying type solid-state imaging device according to the present invention.
Figure 14B:
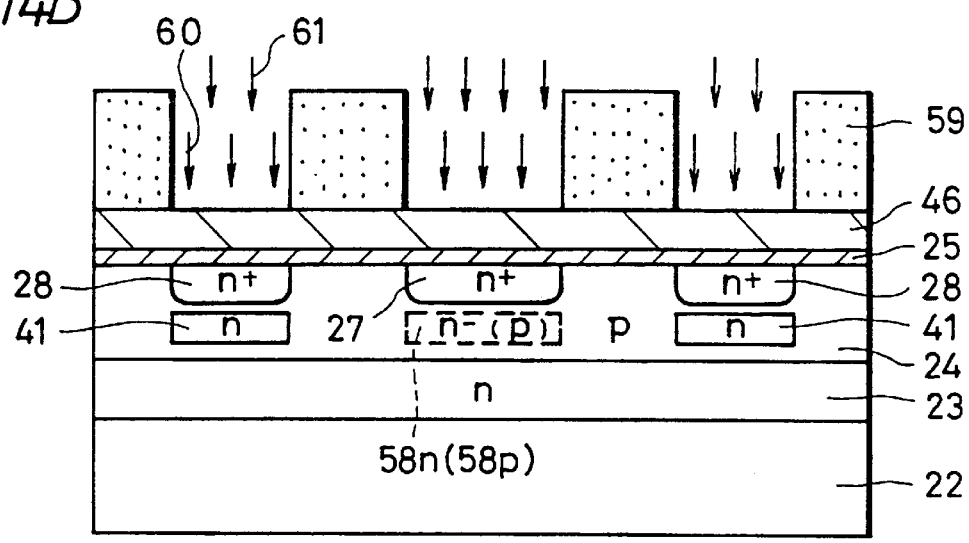
Figure 14C:
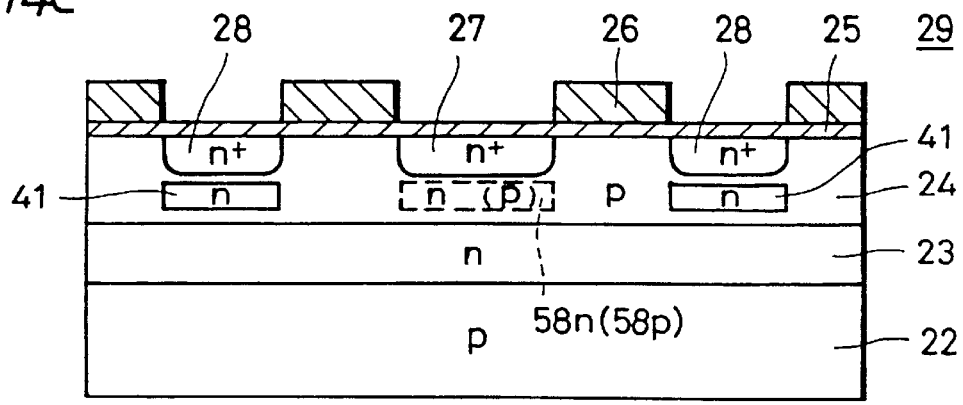

FIGS. 14A through 14C illustrate a method of manufacturing an amplifying type solid-state imaging device according to other embodiment of the present invention.

According to this embodiment, as shown in FIGS. 14A, an n-type overflow-barrier region 23 and a p-type semiconductor well region 24 are sequentially formed on the p-type silicon substrate 22, and a gate insulating film 25 made of $SiO_2$ or the like is formed on the p-type semiconductor well region 24. On the insulating gate film 25 is formed a first photoresist mask 56 having an opening formed at the portion corresponding to a source region which will be formed thereafter. Then, p-type impurity ions 57 are implanted through the first photoresist mask 56, whereby a p-type ion implanted region 58 is formed within the p-type semiconductor well region corresponding to the under portion of the source region.

When the p-type impurity ions for forming the p-type ion implanted region 58 are implanted, if the width of the drain region is narrow, the p-type impurity ions are implanted with a range distance $R_P$ of substantially the same as that of the n-type channel stopper region which will be formed under the drain region and at a dose amount smaller than that of the n-type channel stopper region.

If the width of the drain region is wide, then the p-type impurity ions may be implanted with the range distance $R_P$ of substantially the same as that of the n-type channel stopper region formed under the drain region and at substantially the same dose amount as that of the n-type channel stopper region.

Then, as shown in FIG. 14B, after the first photoresist mask 56 was removed, a thin polycrystalline silicon layer 46 which serves as a gate electrode is deposited on the gate insulating film 25 and a second photoresist mask 59 having patterns corresponding to the gate electrode is deposited on the thin polycrystalline silicon layer 46. Then, through this second photoresist mask 59, first n-type impurity ions 60 are implanted to the p-type well region 24 at the positions corresponding to the under portions of the drain electrode and the source region.

The n-type implanted region, i.e., channel stopper region 41 is formed at the position corresponding to the under portion of the drain region by implanting the first n-type impurity ions 60. Concurrently therewith, the p-type ion implanted region 58 formed just under the source region is returned.

When the dose amount of the p-type ion implanted region 48 is smaller than that of the n-type impurity ion implantation 60, an n-type ion implanted region 58n of low concentration is formed by this implantation. When the dose amount of the p-type ion implanted region 58 is substantially the same as that of the n-type impurity ion implantation 60, such n-type ion implanted region 58n is canceled by the above implantation and returned to the p-type region 58p.

Then, an n-type source region 27 and an n-type source region 28 are formed on the surface of the p-type well region 24 by implanting n-type impurity ions 61 through the second photoresist mask 59.

The sequential order in which the first n-type impurity ions are implanted and the second n-type impurity ions are implanted may be freely selected.

An annular gate electrode 26 is formed by selectively etching away the polycrystalline silicon layer 46 by use of the second photoresist mask 59, and there is obtained a target pixel MOS transistor 29 as shown in FIG. 14C.

According to this manufacturing method, since the source region 27 and the drain region 28 and the n-channel stopper region 41 disposed just under the drain region 28 and the gate electrode 26 can be formed by self-alignment by using the second photoresist mask 59, the channel stopper region 41 can be formed with a high accuracy at the position corresponding to the under portion of the drain region 28.

In addition, if the p-type ion implanted region 58 is previously formed just under the source region 27 in the process before the n-type impurity ions 60 are implanted in order to form the channel stopper region 41, then when the n-type impurity ions are implanted, the p-type ion implanted region 58 just beneath the source region 27 is returned so that the n-type ion region 58n of low concentration is formed just under the source region 27. Alternatively, by this implantation, the p-type ion implanted region 58 is canceled by the n-type impurity so that the n-type ion implanted region can be prevented from being formed under the source region 27.

Figure 15A:
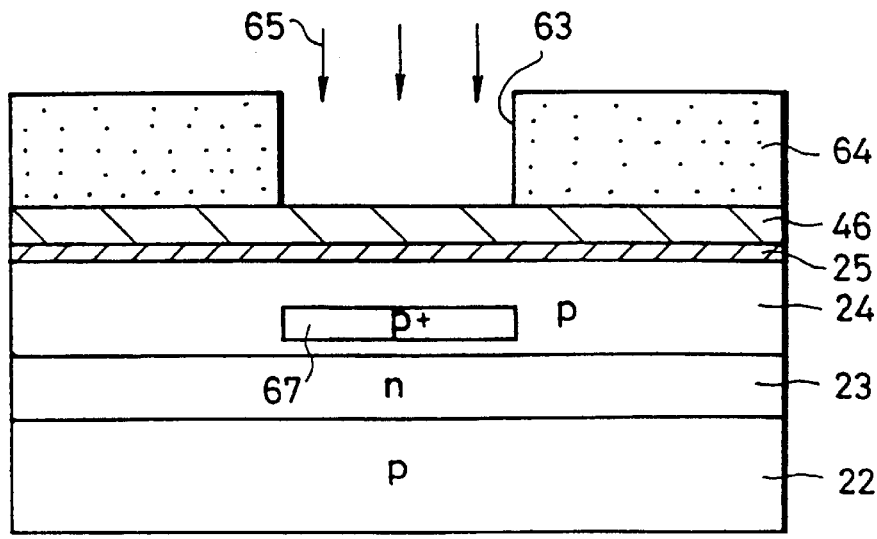
FIGS. 15A through 15C are manufacturing process diagrams showing a further example of a method of manufacturing an amplifying type solid-state imaging device according to the present invention.
Figure 15B:
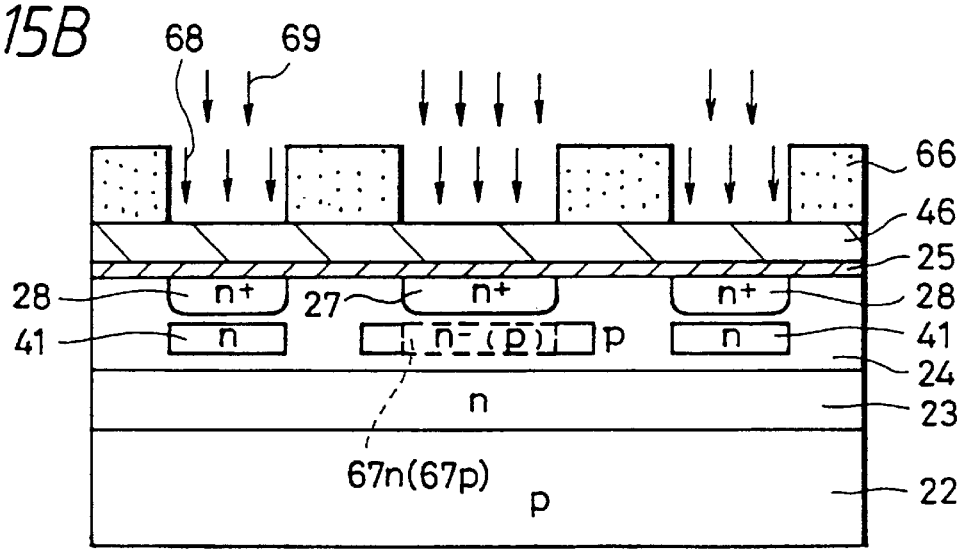
Figure 15C:
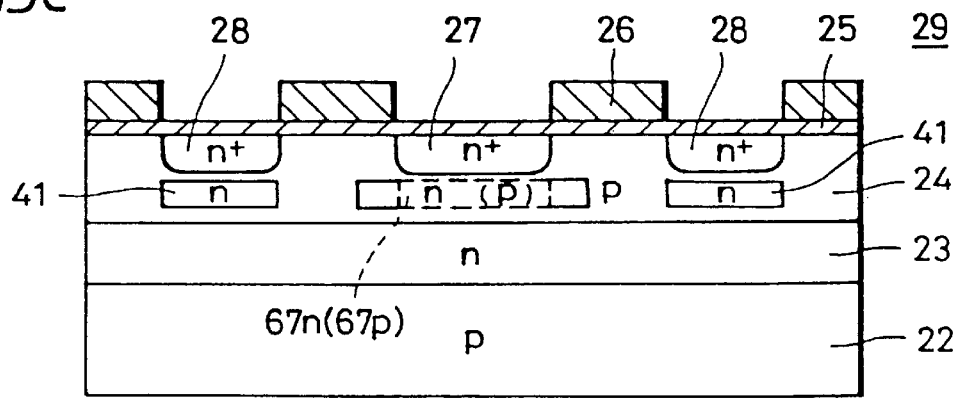

FIGS. 15A through 15C illustrate a method of manufacturing an amplifying type solid-state imaging device according to a further embodiment of the present invention.

According to this embodiment, as shown in FIG. 15A, an n-type overflow-barrier region 23 and a p-type semiconductor well region 24 are sequentially formed on the p-type silicon substrate 22, and a gate insulating film 25 made of $SiO_2$ or the like and a thin polycrystalline silicon layer 46 serving as a gate electrode are formed on the p-type semiconductor well region 24, in that order. Then, on the polycrystalline silicon layer 46 is formed a first photoresist mask 64 having an opening portion 63 formed at the portion corresponding to the region which partly overlaps the source region to the gate portion. Implanting p-type impurity ions 65 through this first photoresist mask 64, a p-type ion implanted region 67 with an area larger than that of the source region is formed within the p-type well region corresponding to the under portion of the source region. P-type impurity ions at that time are implanted under the same conditions as those described with reference to FIGS. 14A to 14C.

Then, as shown in FIG. 15B, the first photoresist mask 65 is removed and a second photoresist mask 66 having patterns corresponding to the gate electrode is formed on the polycrystalline silicon layer 46. Then, first n-type impurity ions 68 are implanted to the positions corresponding to the under portions of the drain region and the source region within the p-type semiconductor well region 24 through the second photoresist mask 66, whereby the n-type channel stopper region 41 is formed at the position corresponding to the under portion of the drain region and the p-type ion implanted region 67 formed just beneath the source region is returned by n-type impurity ions. When the dose amount of the p-type ion implanted region 67 is smaller than that of the n-type impurity ion implantation 68, there is formed an n-type ion implanted region 67n of low concentration by this implantation. By this implantation, the concentration and potential of the n-type ion implanted region 67n formed under the source region 27 can be set independently of those of the channel stopper region 41 formed just under the drain region 28. When the dose amount of the p-type ion implanted region 67 is substantially the same as that of the n-type impurity ion implantation 68, the p-type ion implanted region 67 is canceled by this implantation and returned to the p-type region 67p.

Then, an n-type source region 27 and an n-type drain region 28 are formed on the surface of the p-type semiconductor well region 24 by implanting second n-type impurity ions through the same second photoresist mask 66. The sequential order in which the first n-type impurity ions 68 are implanted and the second n-type impurity ions 69 are implanted may be selected freely.

Then, an annular gate electrode 26 is formed by selectively etching away the polycrystalline silicon layer 46 by use of the second photoresist mask 66, and there is obtained a target pixel MOS transistor 29 as shown in FIG. 15C.

According to this manufacturing method, since the source region 27 and the drain region 28 and the n-type channel stopper region disposed just under the drain region 28 and the gate electrode 26 can be formed by self-alignment by using the second photoresist mask 66, the channel stopper region 41 can be formed at the position corresponding to the under portion of the drain region 28 with a high accuracy.

In addition, if the p-type ion implanted region with the area larger than that of the source region is previously formed just under the source region in the process before n-type impurity ions 68 are implanted when the channel stopper region 41 is formed, then regardless of a little displacement of the second photoresist mask 66, the p-type impurity ion implanted region 67 is returned by implanting the n-type impurity ions 68 leaving the respective ends of the p-type impurity ion implanted region 67, and hence the n-type ion implanted region 67n of low concentration is accurately formed just under the source region 27. Alternatively, due to this implantation, the p-type ion implanted region 67 is canceled by the n-type impurity so that the n-type ion implanted region is not formed under the source region 27. That is, even when the second photoresist mask 66 and the first photoresist mask 65 are displaced from each other, the n-type ion implanted region of substantially the same impurity concentration as that of the channel stopper region can be prevented from being formed at least under the source region 27. The concentration and potential of the n-type ion implanted region 67n can be set independently of those of the channel stopper region 41 similarly as described before.

FIGS. 16A through 16D illustrate a yet further example of a method of manufacturing an amplifying type solid-state imaging device according to the present invention.

Figure 16A:
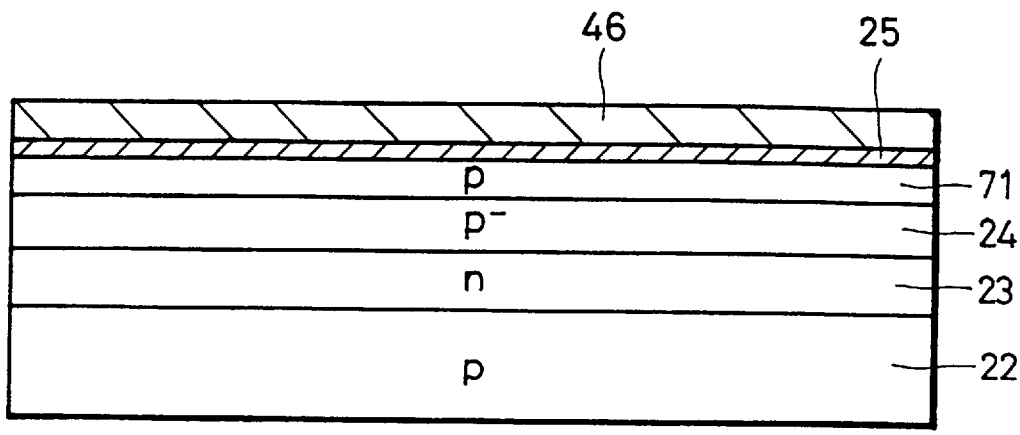
FIGS. 16A through 16D are manufacturing process diagrams showing a yet further example of a method of manufacturing an amplifying type solid-state imaging device according to the present invention.

According to this embodiment, as shown in FIG. 16A, an n-type overflow-barrier region 23 and a p-type semiconductor well region 24 are sequentially formed on a p-type silicon substrate 22. Further, a p-type charge accumulation well region constructing the channel, i.e., so-called sensor well region 71 is formed on which a gate insulating film 25 made of $SiO_2$ or the like and a polycrystalline silicon layer 46 serving as a gate electrode are sequentially formed.

Considering an impurity concentration relationship among the p-type semiconductor substrate 22, the p-type semiconductor well region 24 and the p-type sensor well region 71, the concentration of the sensor well region 71 is highest and those of the p-type semiconductor substrate 22 and the p-type semiconductor well region 24 are lowered in that order.

Figure 16B:
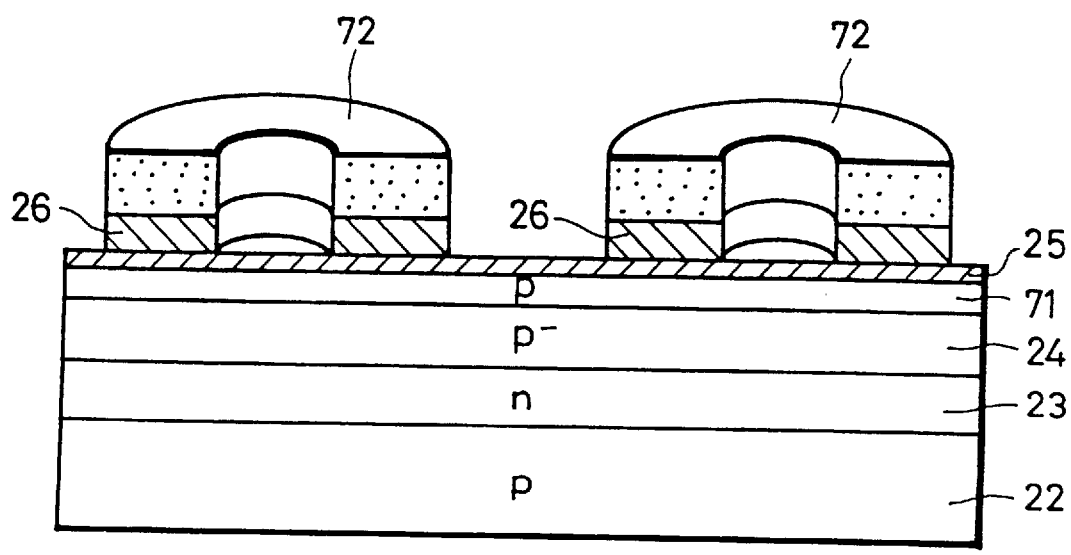

Then, as shown in FIG. 16B, a photoresist mask 72 having a pattern corresponding to a gate electrode is formed on the polycrystalline silicon layer 46. Then, a gate electrode 26 based on the polycrystalline silicon layer 46 is formed by selectively etching the polycrystalline silicon layer 46 by using the photoresist mask 72.

Figure 16C:
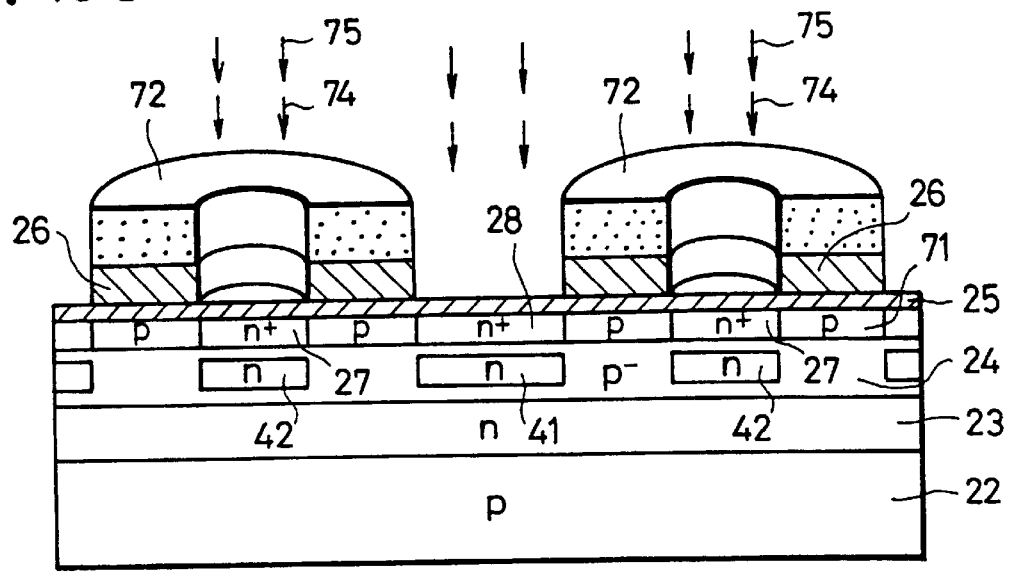

Then, as shown in FIG. 16C, an n-type source region 27 and an n-type drain region 28 are formed by implanting n-type impurity ions 74 by using the same photoresist mask 72. Then, by implanting second n-type impurity ions 75 by using the same photoresist mask 72, n-type ion implanted regions 41 and 42 are formed within the p-type semiconductor well region 24 at a predetermined depth position corresponding to the under portion of the drain region 28 and the source region 27. The n-type ion implanted region 41 corresponding to the under portion of the drain region 28 acts as a channel stopper region. The sequential order in which the first impurity ions 74 and the second impurity ions 75 are implanted may be selected freely.

Figure 16D:
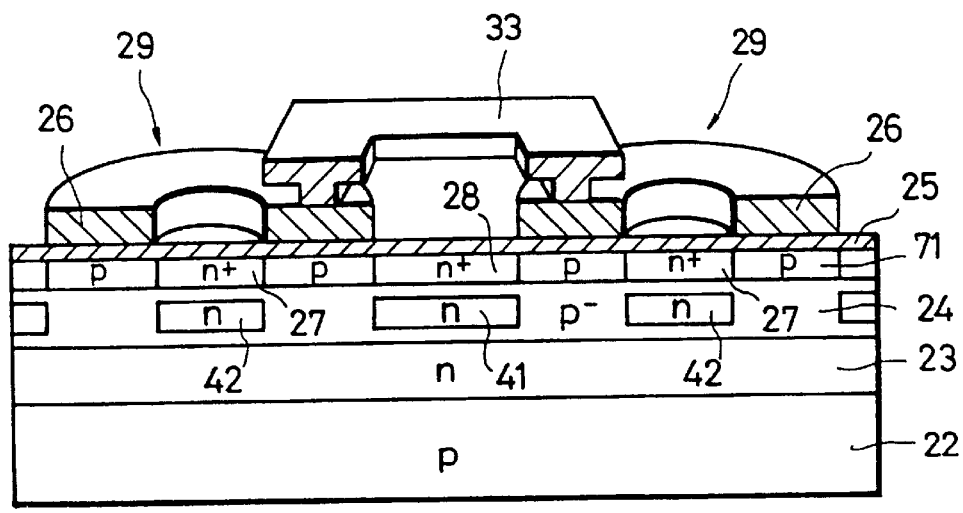

Then, as shown in FIG. 16D, a contact buffer layer (so-called interconnection layer between pixels) made of the same material as that of the gate electrode 26, polycrystalline silicon in this embodiment is formed such that it is connected to the adjacent two gate electrodes 26 through contact holes (not shown) opened in the insulating film on the gate electrode 26, thereby resulting in a target pixel MOS transistor 29 in which the gate electrodes 26 are connected together.

In this pixel MOS transistor, signal charges (holes) h are accumulated in the sensor well region 71 and a channel current (drain current) is changed by the signal charges.

Although the solid-state imaging device is process-damaged when the contact holes is formed, the contact buffer layer 33 and the gate electrode 26 are made of the same material so that the potential shift (i.e., channel potential is locally changed) under the contact portion due to work function difference can be avoided.

According to this manufacturing method, the gate electrode 26, the sensor well region 71 constructing the channel, the source region 27, the drain region 28 and the n-type ion implanted regions 41 and 42 formed beneath the source region 27 and the drain region 28 can be formed by self-alignment by using one photoresist mask 72. Accordingly, the n-type ion implanted region 42 and the channel stop region 41 can be formed at the positions corresponding to the under portions of the source region 27 and the drain region 28 with a high accuracy. At the same time, the mask process can be decreased by one as compared with the case of FIGS. 12A through 12F, and hence the manufacturing process can be simplified.

The sensor well region described with reference to FIGS. 16A to 16D can be applied to the aforementioned embodiments.

In the manufacturing process shown in FIGS. 13 and 14, after the first and second n-type impurity ions are implanted by using the photoresist masks 59 and 66, the gate electrode is formed by patterning the polycrystalline silicon layer 46. The present invention is not limited thereto. For example, after the gate electrode 26 was formed by patterning the polycrystalline silicon layer 46 by using the photoresist masks 59 and 66, the first and second n-type impurity ions may be implanted.

FIG. 17 shows a method of manufacturing an amplifying type solid-state imaging device according to a further embodiment of the present invention. In this embodiment, a photoresist mask is formed on a gate. In the process where ions are implanted through this photoresist mask when a channel stopper region is formed, the channel stopper region is formed by obliquely implanting ions from four directions. Specifically, ions are implanted on a pixel at its portion in which a width of drain region with respect to the horizontal direction and the vertical direction is narrowest parallelly with an inclination angle of larger than 30° and at dose amount of each ¼ from the four directions a, b, c, d.

According to this manufacturing method, a channel stopper region 41 can be formed by effectively implanting n-type impurity ions to the drain region at its narrow width portion in which a potential barrier is most difficult to be formed. In addition, since a concentration of a portion 84 which is hidden in the photoresist mask in the oblique ion implantation is decreased so that the potential of the portion 84 does not rise rapidly than is necessarily but rises with a gentle potential. As a result, since signal charges are photoelectrically-converted in this portion by incident light, this portion other than the portion of this gate electrode 26 also can be utilized as the sensor. As a consequence, the sensor region can be widened in area and a sensitivity can be improved.

Further, since the width of the drain region 28 in the horizontal and vertical directions between the pixels is narrow, if the n-type ion implanted region is similarly formed on the source region 27 with the area larger than the width of the drain region 28, then the reset operation or the electronic shutter operation cannot be carried out satisfactorily due to the influence of the n-type ion implanted region of the wide area formed under the source region. However, in the embodiment shown in FIG. 16, since ions become difficult to be implanted due to the oblique ion implantation, the reset or electronic shutter operation can be carried out satisfactorily.

While the n-channel type transistor is described as the pixel MOS transistor 29 as described above, the present invention can be similarly applied to a p-channel type transistor.

According to the amplifying type solid-state imaging device of the present invention, since the second conductivity-type channel stopper region for signal charges is formed on the first conductivity-type semiconductor region formed just below the drain region comprising the amplifying type pixel transistor, the occurrence of blooming can be suppressed and the amount of signal charges can be increased, whereby the output voltage and the dynamic range can be increased. Further, of photoelectrically-converted holes and electrons, charges (e.g., in the case of n-channel electrons) which do not become signal charges are not accumulated in the overflow-barrier region and absorbed in the drain region through the channel-stopper region, the potential in the overflow-barrier region can be prevented from being modulated by electrons.

The impurity concentration of the channel stopper region is made lower than that of the drain region, whereby signal charges can be discharged to the substrate side in the reset operation or in the electronic shutter operation. Therefore, the reset operation or the electronic shutter operation can be carried out smoothly.

Since the first conductivity-type semiconductor region exists between the source region and the overflow-barrier region, when the reset operation or the electronic shutter operation of the system in which signal charges are discharged to the substrate side is carried out, signal charges can be smoothly discharged to the substrate side without affecting the overflow-barrier region from a potential standpoint.

When the first conductivity-type semiconductor region exists between the channel stopper region and the overflow-barrier region, the channel stopper region can be formed by one ion implantation, and the drain region to the overflow-barrier region can be potentially connected by selecting the impurity concentration without forming the potential dip.

If the potential of the channel stopper region is made shallower than that of the overflow-barrier region and made deeper than that of the drain region, then the occurrence of blooming can be suppressed and the reset operation or the electronic shutter operation can be carried out satisfactorily.

Since the semiconductor substrate includes the means for applying the reset voltage, when the reset or electronic shutter operation is executed, signal charges accumulated under the gate portion of the pixel transistor can be discharged to the substrate side.

When the channel stopper region is formed so as to surround the gate portion, the occurrence of blooming can be prevented more reliably.

When the second conductivity type ion implanted region of impurity concentration lower than that of the channel stopper region is formed within the first conductivity-type semiconductor region formed just under the source region, particularly in the structure in which the width of the drain region is narrow, the potential barrier can be formed satisfactorily in the overflow-barrier region.

According to the method of manufacturing the amplifying type solid-state imaging device of the present invention, the source region, the drain region and the gate electrode constructing the amplifying type pixel transistor are formed by self-alignment and also, the second conductivity-type channel stopper region can be formed on the first conductivity-type semiconductor region formed just below the drain region with a high accuracy. Therefore, it is possible to manufacture the solid-state imaging device in which the occurrence of blooming can be suppressed and the amount of signal charges can be increased.

Further, the source region and the drain region and the channel stopper region formed below the drain region and the gate electrode can be formed by self-alignment. Also, the concentration of the second conductivity-type ion implanted region formed beneath the source region can be set independently of the channel stopper region.

Furthermore, it is possible to form an amplifying type solid-state imaging device in which the occurrence of blooming can be prevented and the reset operation or the electronic shutter operation can be carried out without being affected by the displacement of mask.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A solid-state imaging device comprising:
   a first conductivity-type semiconductor substrate on which a second conductivity-type overflow-barrier region and a first conductivity-type semiconductor region are formed sequentially;
   a pixel transistor comprising a source region, a drain region and a gate portion formed on said first conductivity-type semiconductor; and
   a second conductivity-type channel stopper region for signal charges accumulated in said first conductivity-type semiconductor region of said gate portion, said channel stopper region formed within said first conductivity-type semiconductor region just below said drain region.

2. A solid-state imaging device according to claim 1, in which an impurity concentration of said channel stopper region is lower than that of said drain region.

3. A solid-state imaging device according to claim 1, in which said first conductivity-type semiconductor region exists between said source region and said overflow-barrier region.

4. A solid-state imaging device according to claim 1, in which said first conductivity-type semiconductor region exists between said channel stopper region and said overflow-barrier region.

5. A solid-state imaging device according to claim 1, in which a potential of said channel stopper region is shallower than that of said overflow-barrier region and deeper than that of said drain region.

6. A solid-state imaging device according to claim 1, further comprising means for applying a reset voltage to said semiconductor substrate.

7. A solid-state imaging device according to claim 1, in which said channel stopper region is formed so as to surround said gate portion.

8. A solid-state imaging device according to claim 1, in which a second conductivity-type ion implanted region of impurity concentration lower than that of said channel stopper region is formed within said first conductivity-type semiconductor region formed just below said source region.

9. A solid-state imaging device of claim 1, wherein said device is a MOS transistor and further comprises a second conductivity-type region formed with said first conductivity-type semiconductor region just below said source region and which has a lower imprinting concentration than that of said channel stopper region.

* * * * *